(12) United States Patent
Okamoto et al.

(10) Patent No.: US 7,688,687 B2
(45) Date of Patent: Mar. 30, 2010

(54) TIMING EXTRACTOR, AND INFORMATION PLAYBACK APPARATUS AND DVD DEVICE USING THE TIMING EXTRACTOR

(75) Inventors: Kouji Okamoto, Osaka (JP); Akira Yamamoto, Osaka (JP); Hiroki Mouri, Osaka (JP)

(73) Assignee: Panasonic Corporation, Osaka (JP)

( * ) Notice: Subject to any disclaimer, the term of this patent is extended or adjusted under 35 U.S.C. 154(b) by 526 days.

(21) Appl. No.: 11/667,299

(22) PCT Filed: Jul. 18, 2006

(86) PCT No.: PCT/JP2006/314171

§ 371 (c)(1),
(2), (4) Date: May 8, 2007

(87) PCT Pub. No.: WO2007/060765

PCT Pub. Date: May 31, 2007

(65) Prior Publication Data

US 2009/0086588 A1    Apr. 2, 2009

(30) Foreign Application Priority Data

Nov. 28, 2005    (JP) .............................. 2005-341734

(51) Int. Cl.
G11B 7/085    (2006.01)
(52) U.S. Cl. .................................... 369/30.25
(58) Field of Classification Search ............... 369/30.25, 369/30.03, 30.18, 30.22, 30.27; 360/46, 360/29, 51, 53; 386/52, 55, 98; 375/350, 375/340, 361
See application file for complete search history.

(56) References Cited

U.S. PATENT DOCUMENTS

| | | | |
|---|---|---|---|
| 5,422,760 A * | 6/1995 | Abbott et al. | ................. 360/46 |
| 6,792,063 B1 | 9/2004 | Ogura | |
| 2002/0114616 A1 | 8/2002 | Okamoto | |

FOREIGN PATENT DOCUMENTS

| | | |
|---|---|---|
| JP | 5-266602 A | 10/1993 |
| JP | 8-161829 A | 6/1996 |
| JP | 8-203206 A | 8/1996 |
| JP | 2002-8315 A | 1/2002 |
| JP | 2002-190165 A | 7/2002 |
| WO | WO 00/36602 | 6/2000 |

* cited by examiner

*Primary Examiner*—Ali Neyzari
(74) *Attorney, Agent, or Firm*—McDermott Will & Emery LLP

(57) ABSTRACT

In a feedforward timing extractor for extracting timing information from a playback signal, a frequency ratio calculation section 2 calculates the ratio between the frequency of the playback signal and the frequency of the output clock of a frequency synthesizer 6 by utilizing a specific pattern and a specific pattern appearing interval in the playback signal. A control section 4 controls the frequency dividing rate of the frequency synthesizer 6 in such a manner that the frequency ratio calculated by the frequency ratio calculation section 2 has a set value. Thus, as compared with a case in which the output clock of the frequency synthesizer 6 is a high-frequency fixed-rate clock, it is not necessary to operate the digital circuits at high speeds. Consequently, even in cases where the playback frequency (the playback rate) of the signal changes with time, the decimation rate at which pulses of a fixed clock are eliminated is constant, thereby reducing power consumption.

19 Claims, 21 Drawing Sheets

TIMING EXTRACTOR, AND INFORMATION PLAYBACK APPARATUS AND DVD DEVICE USING THE TIMING EXTRACTOR

RELATED APPLICATIONS

This application is the U.S. National Phase under 35 U.S.C. § 371 of International Application No. PCT/JP2006/314171, filed on Jul. 18, 2006, which in turn claims the benefit of Japanese Application No. 2005-341734, filed on Nov. 28, 2005, the disclosures of which Applications are incorporated by reference herein.

TECHNICAL FIELD

The present invention relates to a timing extractor for extracting timing information from a playback signal read from a recording medium, such as an optical disk.

BACKGROUND ART

Conventional timing extractors used in optical disk playback devices and the like include a feedback timing extractor described in Patent Document 1, for example. In this feedback timing extractor, as shown in a block structure in FIG. 20, an input playback signal is quantized by an A/D converter 1, and, based on the quantized data provided through an offset correction section 8, a phase frequency comparator 13 calculates a frequency error and a phase error. Then, the amount of the digital correction obtained, which is provided by way of a loop filter 14, is converted into an analog value by a D/A converter (not shown), so that the oscillation frequency of a VCO (a voltage controlled oscillator) 15 is controlled. By performing this feedback control, synchronization is achieved between a clock for driving the A/D converter 1 and the digital sections 8, 13, and 14 and the playback signal. For the data decoding, decoding processing can be performed based on the quantized data, because the clock and the quantized data are synchronized with each other.

On the other hand, a feedforward timing extraction circuit which uses a frequency synthesizer operating at a fixed rate is discussed in Patent Document 2. FIG. 21 illustrates a block structure in the feedforward timing extractor. This feedforward system uses an A/D converter 1 which quantizes a playback signal in accordance with a constant cycle (fixed rate) clock generated and output by a constant clock oscillator 18. Based on the digital data sequence quantized by the A/D converter 1 and on the fixed rate clock, a synchronous clock arithmetic circuit 17 estimates the edge positions of a synchronous clock, and an interpolation circuit 16 performs interpolation processing on the quantized data, while pulses of the fixed rate clock are eliminated to generate a pseudo-synchronous clock Data CLK. The quantized data obtained after the interpolation processing and the pseudo-synchronous clock Data CLK are used to perform decoding process.

In the conventional feedback structure described in Patent Document 1, if high-speed playback is necessary, the digital circuits need pipeline registers for timing compensation, which results in increase in clock latency. Thus, the feedback structure has a problem in that the stability of the loop deteriorates easily.

In contrast to this, in the feedforward control, the amount of correction is calculated from the quantized data sequence, and the correction processing is performed on the already quantized data sequence. The feedforward control thus has the advantage of being free from the influence of clock latency, and is suitable for high-speed playback.

Patent Document 1: Japanese Laid-Open Publication No. 2002-8315
Patent Document 2: Japanese Laid-Open Publication No. 8-161829

DISCLOSURE OF THE INVENTION

Problems that the Invention Intends to Solve

The feedforward timing extractor, however, needs the clock that always operates at the fixed rate (for the generation of which, a frequency synthesizer or the like is typically used), and is based on the premise that the frequency of this clock is oversampled with respect to the playback frequency (the playback rate) of the playback signal. Therefore, once the playback frequency (the playback rate) of the playback signal has been determined, the clock operating at the fixed rate must be set so that the frequency thereof is higher than the playback frequency (the playback rate). Where the playback frequency (the playback rate) changes with time, the frequency of the fixed rate clock is set to a value higher than the maximum value of the playback frequency (the playback rate). This means that, in a state where the playback frequency (the playback rate) is low, the frequency of the fixed rate clock is excessively oversampled, causing an increase in power consumption when the system as a whole is considered. FIG. 22 shows relationships between the fixed CLK and Data CLK shown in FIG. 21 when the playback speed changes continuously. When the playback speed is high, timing intervals at which the fixed-clock decimation is performed become shortened. When the playback speed is low, the fixed-clock decimation intervals are lengthened, and the digital circuits thus operate at excessively high speeds, resulting in an increase in power consumption. Furthermore, in a case where a digital waveform equalizer that operates on a constant clock is connected to the output stage of the A/D converter, the settings of the coefficient and the like of the waveform equalizer must be changed according to the playback rate, which produces a problem in that control becomes complicated.

In view of the above-described problems with the conventional timing extractors, it is an object of the present invention to provide a feedforward timing extractor for extracting timing information from a playback signal, in which even if the playback frequency (the playback rate) changes with time, fixed-clock decimation is performed at a constant rate to optimize power consumption, while it is possible to simplify control in a case where a digital waveform equalizer operating on a constant clock is connected to the output stage of an A/D converter.

Means for Solving the Problems

In order to achieve the object, according to the present invention, in a feedforward timing extractor for extracting timing information from a playback signal, the frequency dividing rate of a clock generation section is adjusted so that the ratio between the frequency of the output clock of the clock generation section and the playback frequency (the playback rate) of the playback signal is constant.

Specifically, an inventive timing extractor in an information playback apparatus for extracting data and recording timing of the data from a playback signal includes: a clock generation section for generating a clock according to a set frequency dividing rate and outputting the generated clock; quantization means for quantizing the playback signal in accordance with timing of the output clock of the clock generation section and outputting the quantized signal; a frequency ratio calculation section for measuring either a specific pattern or an interval between two consecutively appearing specific patterns contained in an output sequence of the quantized signal from the quantization means, or both the specific pattern and the specific pattern appearing interval, in accordance with the output clock of the clock generation section, and calculating, based on a value obtained by the measurement, a frequency ratio between a playback frequency of the playback signal and a frequency of the output clock of the clock generation section; a phase correction amount calculation section for calculating the amount of phase correction for the output clock of the clock generation section with respect to the quantized signal from the quantization means; a control section for receiving the frequency ratio calculated by the frequency ratio calculation section and the amount of phase correction calculated by the phase correction amount calculation section, and calculating and setting the frequency dividing rate of the clock generation section and a cycle of the output clock of the clock generation section with respect to a playback cycle of the playback signal; and a pseudo-synchronous clock generation section for eliminating, based on an output from the control section, pulses of the output clock of the clock generation section to generate a pseudo-synchronous clock that is synchronized with the recording timing of the recorded data in a pseudo-manner, the output of the control section being the cycle of the output clock of the clock generation section with respect to the playback cycle of the playback signal.

In the inventive timing extractor, where a playback processing start signal or a playback processing restart signal has been input, the control section sets the frequency dividing rate of the clock generation section in such a manner that the frequency ratio of the frequency ratio calculation section equals a predetermined value, and then the control section updates the frequency dividing rate of the clock generation section so that the frequency ratio of the frequency ratio calculation section is constant, in accordance with the amount of phase correction from the phase correction amount calculation section.

In the inventive timing extractor, where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section exceeds a predetermined threshold value, the control section updates the frequency dividing rate of the clock generation section in such a manner that the frequency ratio of the frequency ratio calculation section is equal to or smaller than the threshold value, by using the amount of phase correction from the phase correction amount calculation section.

In the inventive timing extractor, where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section varies, the control section updates the frequency dividing rate of the clock generation section so that the frequency ratio of the frequency ratio calculation section is constant.

In the inventive timing extractor, where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section exceeds a predetermined threshold value, the control section updates the frequency dividing rate of the clock generation section so that the frequency ratio of the frequency ratio calculation section is equal to or smaller than the threshold value.

The inventive timing extractor further includes a restart signal generation section for, after playback processing is started, measuring the specific pattern appearing interval contained in the output sequence of the quantized signal from the quantization means in accordance with the pseudo-synchronous clock from the pseudo-synchronous clock generation section, comparing the measured specific pattern appearing interval with an ideal value obtained by measuring the specific pattern appearing interval in accordance with a synchronization clock, and, if the specific pattern appearing interval measured in accordance with the pseudo-synchronous clock exceeds a predetermined value consecutively for a predetermined number of times, generating a restart signal for updating the frequency dividing rate of the clock generation section.

The inventive timing extractor further includes a restart signal generation section for generating a restart signal, if, in a case where a playback processing start signal or a playback processing restart signal has been input, the frequency ratio of the frequency ratio calculation section exceeds a predetermined value consecutively for a predetermined number of times after the control section sets the frequency dividing rate of the clock generation section in such a manner that the frequency ratio of the frequency ratio calculation section equals the predetermined value.

In the inventive timing extractor, where a playback processing start signal or a playback processing restart signal has been input, the control section sets the frequency dividing rate of the clock generation section in such a manner that the frequency of the output clock of the clock generation section does not fall below a predetermined frequency.

In the inventive timing extractor, the control section uses the frequency ratio of the frequency ratio calculation section and results of smoothing processing performed on the amount of phase correction from the phase correction amount calculation section to calculate the playback cycle of the clock generation section with respect to the playback cycle of the playback signal and outputs the calculated playback cycle to the pseudo-synchronous clock generation section.

In the inventive timing extractor, where the output sequence of the quantized signal from the quantization means is converted into binary digits 0s and 1s, a ratio between successive 0s and successive is in the specific pattern is 14:4 or 4:14 when a medium where the data has been recorded is a DVD-ROM or a DVD-RAM, 11:11 when the medium is a CD, and 2:9:9 or 9:9:2 when the medium is a Blu-ray disc.

In the inventive timing extractor, if measured in accordance with the playback rate of the playback signal, the specific pattern appearing interval in the output sequence of the quantized signal from the quantization means is 1488 when a medium where the data has been recorded is a DVD-ROM or a DVD-RAM, 588 when the medium is a CD, and 1932 when the medium is a Blu-ray disc.

In the inventive timing extractor, an offset correction means for correcting an offset contained in the output of the quantization means is connected to the output of the quantization means, and the frequency ratio calculation section and the phase correction amount calculation section operate using an output from the offset correction means instead of the output of the quantization means.

In the inventive timing extractor, a waveform equalization means for equalizing the waveform of the output of the quantization means in accordance with the output clock of the clock generation section is connected to the output of the quantization means, and the frequency ratio calculation section and the phase correction amount calculation section operate using an output from the waveform equalization means instead of the output of the quantization means.

In the inventive timing extractor, an analog filter for performing waveform equalization processing or high-frequency noise removal processing on the playback signal is connected to an input of the quantization means, and equalization characteristics or cutoff characteristics of the analog filter are varied in accordance with the frequency dividing rate of the clock generation section that is output from the control section.

In the inventive timing extractor, the frequency dividing rate of the clock generation section that is output from the control section has an integer portion and a fraction portion, and the clock generation section is a frequency synthesizer capable of fractional frequency division control.

An inventive information playback apparatus includes: the timing extractor, and a signal processing circuit for decoding the data from the output of the quantization means included in the timing extractor in accordance with an output from the pseudo-synchronous clock generation section included in the timing extractor.

An inventive DVD device includes: the timing extractor, and a signal processing circuit for decoding the data from the output of the quantization means included in the timing extractor in accordance with an output from the pseudo-synchronous clock generation section included in the timing extractor.

In the inventive timing extractor, the playback signal is supplied through a radio communication path or other communication path such as an optical fiber, a coaxial cable, or an electric power line.

In the inventive timing extractor, the playback signal is supplied from an optical disc, such as a DVD disc, a CD disc, or a Blu-ray disc.

As described above, according to the present invention, in the feedforward timing extractors for extracting timing information from a playback signal, the frequency ratio calculation section measures the specific pattern or the specific pattern appearing interval contained in the output sequence of the quantized signal from the quantization means, or both the specific pattern and the specific pattern appearing interval, in accordance with the output clock of the clock generation section, and then calculates the ratio between the playback frequency (the playback rate) of the playback signal and the frequency of the output clock of the clock generation section. And the frequency dividing rate set in the clock generation section is updated by the control section in accordance with the calculated frequency ratio so that the calculated frequency ratio equals a predetermined frequency ratio, for example. Thus, even if the signal's playback rate changes to a higher or lower rate, the ratio between the frequency of the playback signal and the frequency of the output clock of the clock generation section is always kept constant, whereby the decimation interval at which pulses of the output clock of the clock generation section are eliminated can be set constant (or within a certain range). As a result, as compared with the conventional case in which, considering variation in the playback rate of a signal, the output clock of the clock generation section is a high-frequency fixed-rate clock, it is not necessary to operate the digital circuits at high speeds, thereby reducing power consumption.

Furthermore, even in a case where a digital waveform equalizer is connected to the output stage of the A/D converter, once coefficient control of the digital waveform equalizer has been determined, the frequency characteristics of the waveform equalizer are kept substantially the same even if the frequency of the playback signal varies. Thus, the control is very simplified.

EFFECTS OF THE INVENTION

As described above, in the inventive feedforward timing extractors for extracting timing information from a playback signal, the ratio between the playback frequency (the playback rate) of the playback signal and the frequency of the output clock of the clock generation section is controlled so as to be a desired constant value or a value within a predetermined range. It is thus possible to provide the timing extractors in which the system's power consumption can be optimized and the control can be simplified.

BRIEF DESCRIPTION OF DRAWINGS

FIG. 20 is a block diagram illustrating the structure of a conventional feedback timing extractor used in an optical disk playback device or the like.

FIG. 21 is a block diagram illustrating the structure of a conventional feedforward timing extractor used in an optical disk playback device or the like.

EXPLANATION OF THE REFERENCE CHARACTERS

| | |
|---|---|
| 1 | A/D converter (quantization means) |
| 2, 2a, 2b | Frequency ratio calculation section |
| 3 | Phase correction amount calculation section |
| 4 | Control section |
| 5 | Pseudo-synchronous clock generation section |
| 6 | Frequency synthesizer (Clock generation section) |
| 8 | Offset correction section |
| 10 | Information recording section |
| 11 | Information reading section |
| 12 | LSI including timing extractor |
| 13, 61 | Phase frequency comparator |
| 14, 63 | Loop filter |
| 15 | Oscillator |
| 16 | Interpolation circuit |
| 17 | Synchronous clock arithmetic circuit |
| 18 | Constant clock oscillator |
| 21 | Sync mark detector |
| 22 | Divider |
| 23, 25 | Set value |
| 24 | Sync mark interval counter |
| 41 | Frequency ratio lock detector |
| 42 | Smoothing filter |
| 43, 425 | Adder |
| 44 | Target frequency ratio setting section |
| 45 | Frequency dividing rate calculation section |
| 51 | Edge generation circuit |
| 52 | AND circuit |
| 62 | Charge pump |
| 64 | VCO |
| 65 | Frequency divider |
| 66 | Pulse swallow counter |
| 67 | ΔΣ modulator |
| 71, 72 | Start/restart signal generation section (Restart signal generation section) |
| 91 | Waveform equalizer |
| 92 | Analog filter |
| 421 | Selector |
| 422, 423 | Multiplier |
| 424 | Integrator |

BEST MODE FOR CARRYING OUT THE INVENTION

Hereinafter, embodiments of the present invention will be described in detail with reference to the accompanying drawings.

First Embodiment

Figure 1:
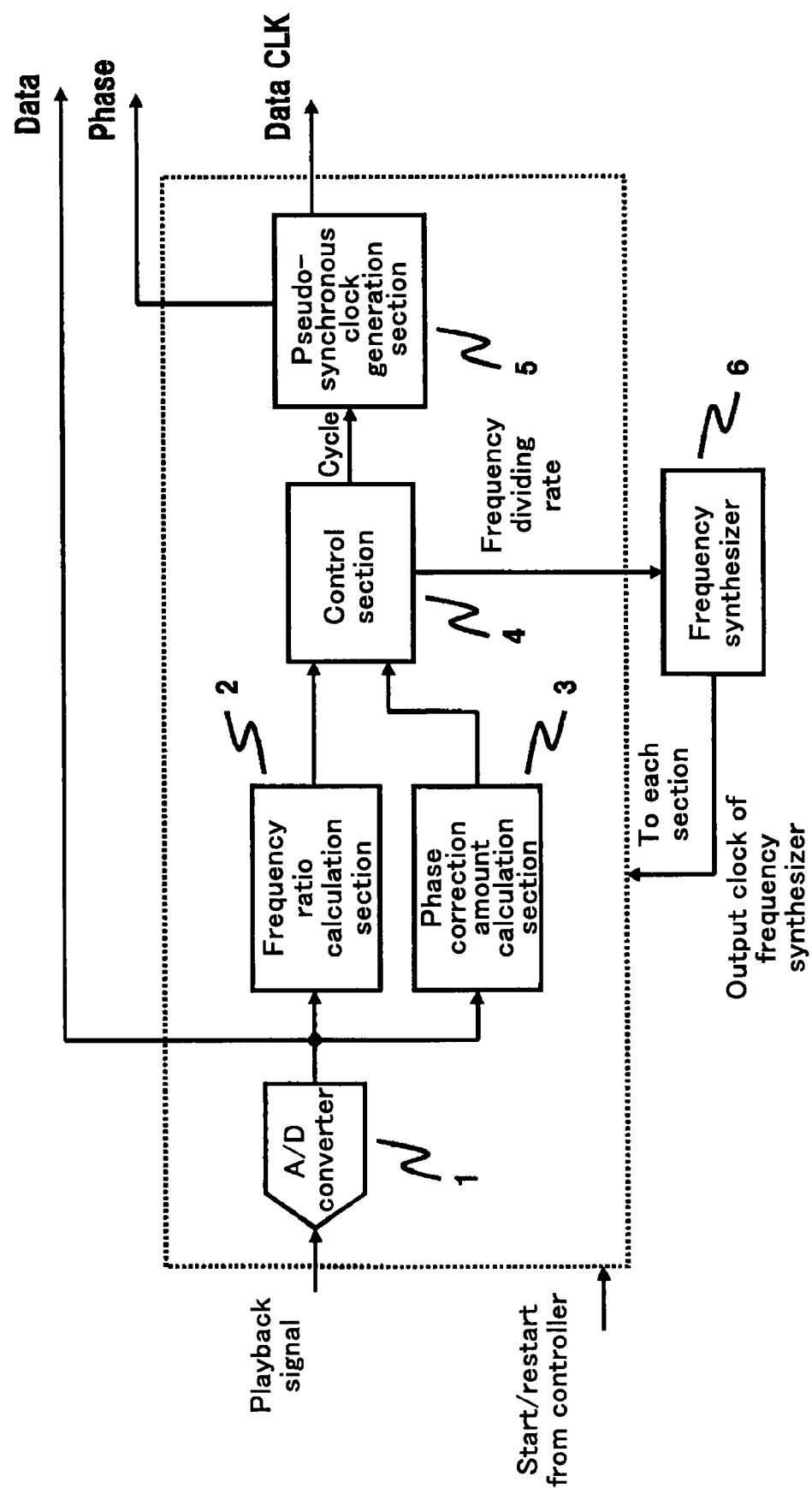
FIG. 1 is a block diagram illustrating a timing extractor according to a first embodiment of the present invention.

FIG. 1 is a block diagram illustrating a timing extractor according to a first embodiment of the present invention. The timing extractor according to this embodiment shows an example in an information playback apparatus for extracting, from an analog playback signal obtained when data recorded on a recording medium, such as an optical disk, is played back, the recorded data and the data's recording timing. In FIG. 1, the reference numeral 1 refers to an A/D converter; 2 to a frequency ratio calculation section; 3 to a phase correction amount calculation section; 4 to a control section; 5 to a pseudo-synchronous clock generation section; and 6 to a frequency synthesizer (a clock generation section). Detailed operation of each block will be described below.

The A/D converter 1 samples and quantizes an input playback signal in accordance with the output clock of the frequency synthesizer 6 and outputs the sampled data.

The frequency ratio calculation section 2 measures, from the output sequence of the A/D converter (quantization means) 1, a specific pattern or an interval at which the specific pattern appears, or both the specific pattern and the specific pattern appearing interval, in accordance with the output clock of the frequency synthesizer 6. Based on the measured value, the frequency ratio calculation section 2 calculates the ratio between the playback frequency (the playback rate) of the playback signal and the frequency of the output clock of the frequency synthesizer 6. When the playback signal is read from a DVD or a CD, for example, a sync mark is used as the specific pattern.

Figure 2:
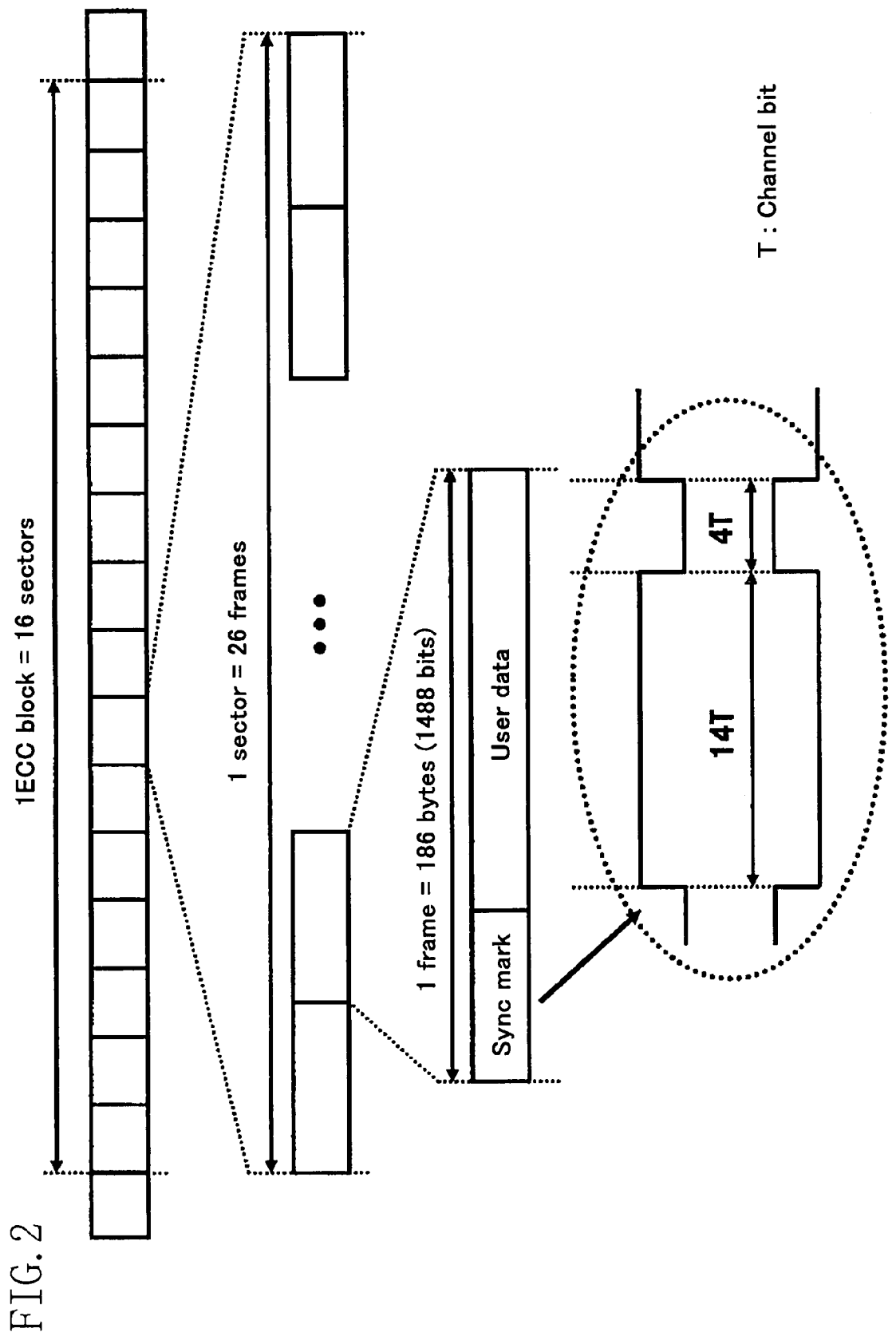
FIG. 2 is a view illustrating the data format of a DVD.

FIG. 2 shows the data format of a DVD-ROM. The DVD-ROM is composed of ECC blocks (Error Correction Coding Blocks). Each ECC block includes 16 sectors, and each sector includes 26 frames. Each frame contains 1488 channel-bit data, and the header portion thereof has a sync mark inserted therein. This sync mark is a specific pattern having predetermined bit intervals. For example, in the case of a DVD-ROM, a sync mark contains successive 14-channel-bit "1"s and successive 4-channel-bit "0"s, or contains successive 14-channel-bit "0"s and successive 4-channel-bit "1"s. In this case, the sync mark appears in each 1488-channel-bit data. In the case of a CD, a sync mark contains successive 11-channel-bit "0"s and successive 11-channel-bit "1"s, or contains the opposite combination thereof, and appears in each 588-channel-bit data. In the case of a Blu-ray disc, a sync mark contains successive 2-channel-bit "0"s, successive 9-channel-bit "1"s, and successive 9-channel-bit "0"s, or contains the opposite combination thereof, and appears in each 1932-channel-bit data. Such sync marks are patterns that do not appear in user data. Thus, the ratio between the playback frequency (the playback rate) of a playback signal and the frequency of the frequency synthesizer can be calculated by using the sync marks.

Figure 3:
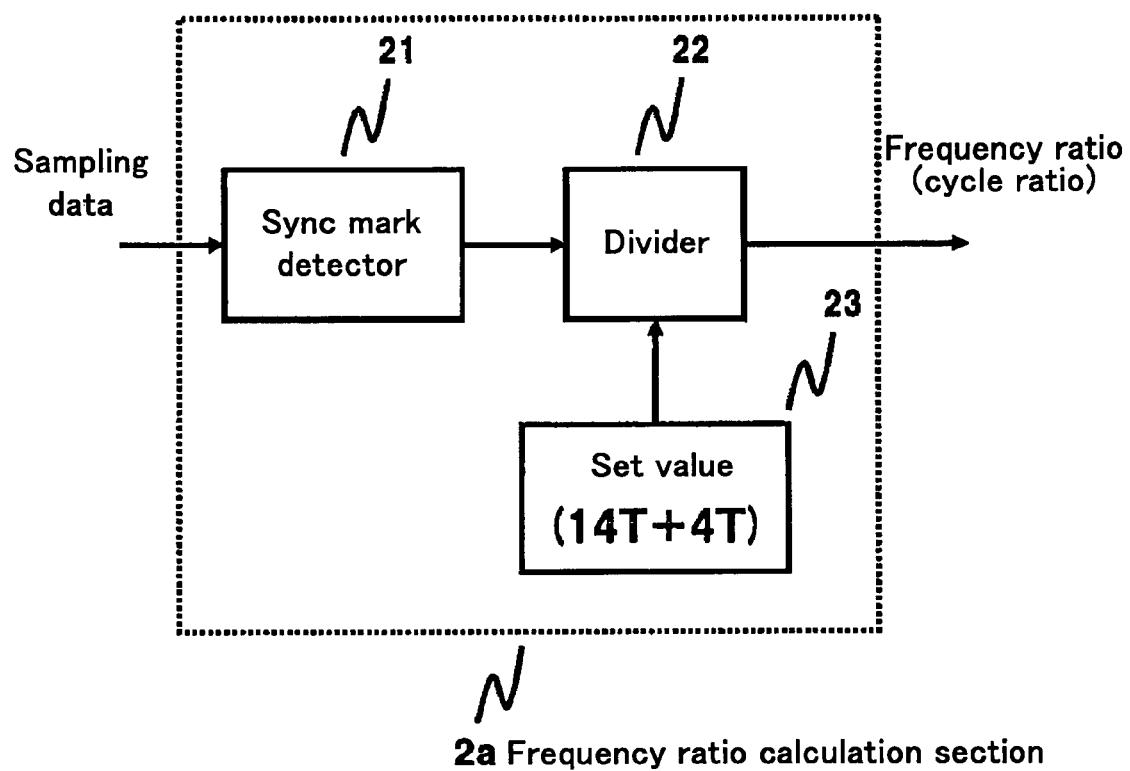
FIG. 3 is a block diagram of a frequency ratio calculation section 2 illustrated in FIG. 1.

For example, in FIG. 3, a sync mark detector 21, a divider 22, and a sync mark set value 23 form the frequency ratio calculation section 2. The sync mark detector 21 detects sync marks from the output sequence of the A/D converter 1. However, in this structure, since the A/D converter 1 does not necessarily operate in accordance with the channel bit cycle, the output sequence of the A/D converter 1 must be digitized, and the sync mark detection has to be performed based on the state transition intervals in the digitized output sequence. In the case of a DVD ROM, for example, it may be determined that sync marks have been detected, when the state transition interval ratio is proportional to a ratio of 14 to 4 (7 to 2). In the sync mark detection, a margin may be set in the state transition interval ratio. In this way, by obtaining the ratio between the sync marks measured in accordance with the output clock of the frequency synthesizer 6 and the sync marks counted in accordance with the channel bit cycle (14T+4T: T is the channel bit cycle), it is possible to calculate the frequency ratio (the cycle ratio) between the playback frequency (the playback rate) of the playback signal and the frequency of the frequency synthesizer.

Figure 4:
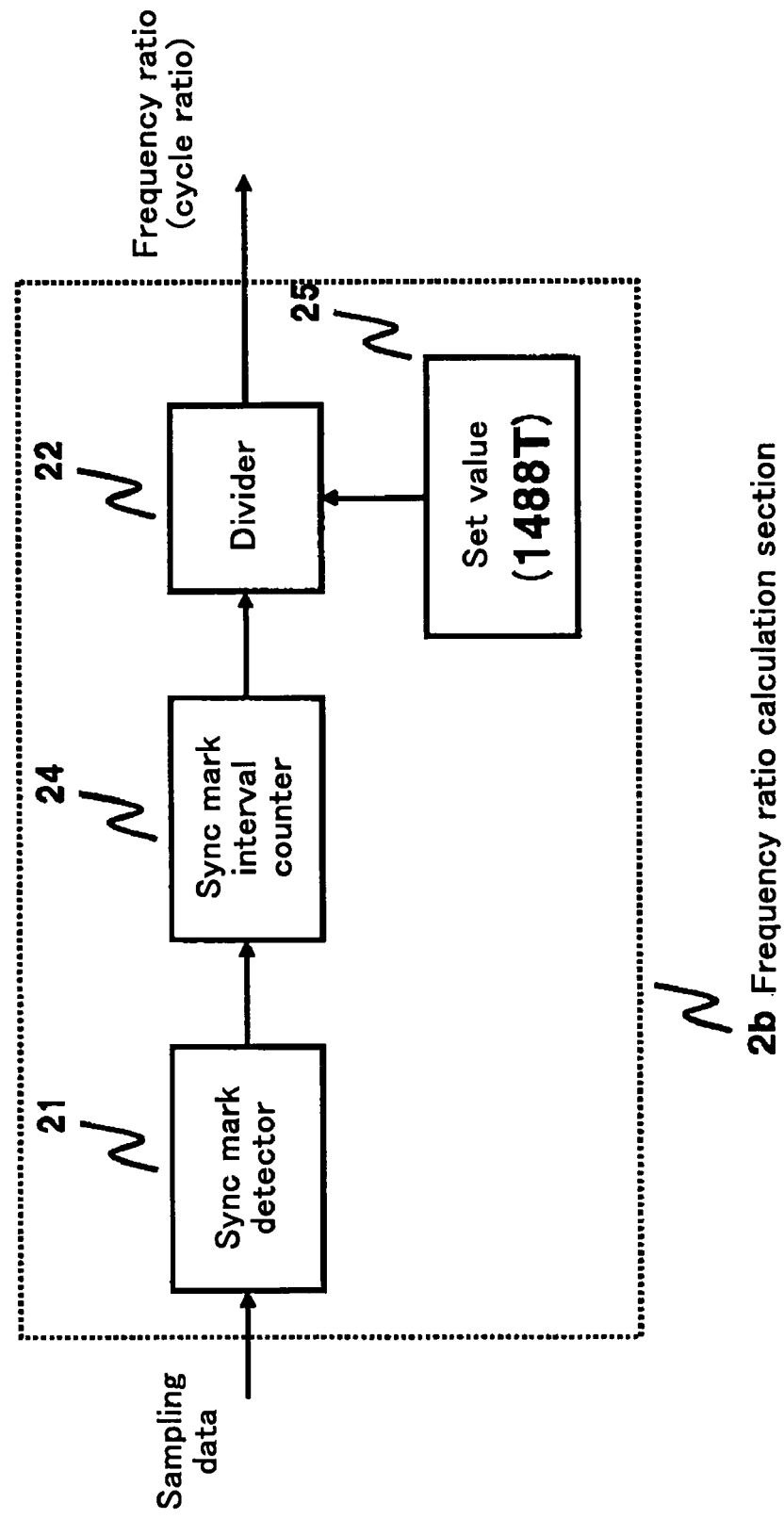
FIG. 4 is another block diagram of the frequency ratio calculation section 2 illustrated in FIG. 1.

The frequency ratio calculation section 3 may have another structure shown in FIG. 4. In FIG. 4, the reference numeral 21 refers to a sync mark detector; 24 to a sync mark interval counter; 22 to a divider, and 25 to a sync mark interval set value. This structure differs from the system shown in FIG. 3 in that the interval between two consecutive sync marks detected by the sync mark detector 21 is counted by using the output clock of the frequency synthesizer 6, and the obtained measurement value (i.e., the output of the sync mark interval counter 24) is used to calculate the frequency ratio (the cycle ratio). In the case of a DVD-ROM, since a sync mark appears in each 1488-channel-bit data, a more precise frequency ratio (cycle ratio) can be calculated by using these sync marks.

Once the frequency ratio (or the cycle ratio) between the playback frequency (the playback rate) of the playback signal and the frequency of the output clock of the frequency synthesizer 6 has been calculated, the ratio of the cycle of the frequency synthesizer 6 to the playback cycle can be calculated, and hence the decimation timing at which pulses of the output clock of the frequency synthesizer 6 are eliminated in the pseudo-synchronous clock generation section 5 can be calculated. In the decimation timing, the output result of the phase correction amount calculation section 3 must be reflected with consideration given to jitter in the playback signal and to variation in the frequency thereof.

Figure 5:
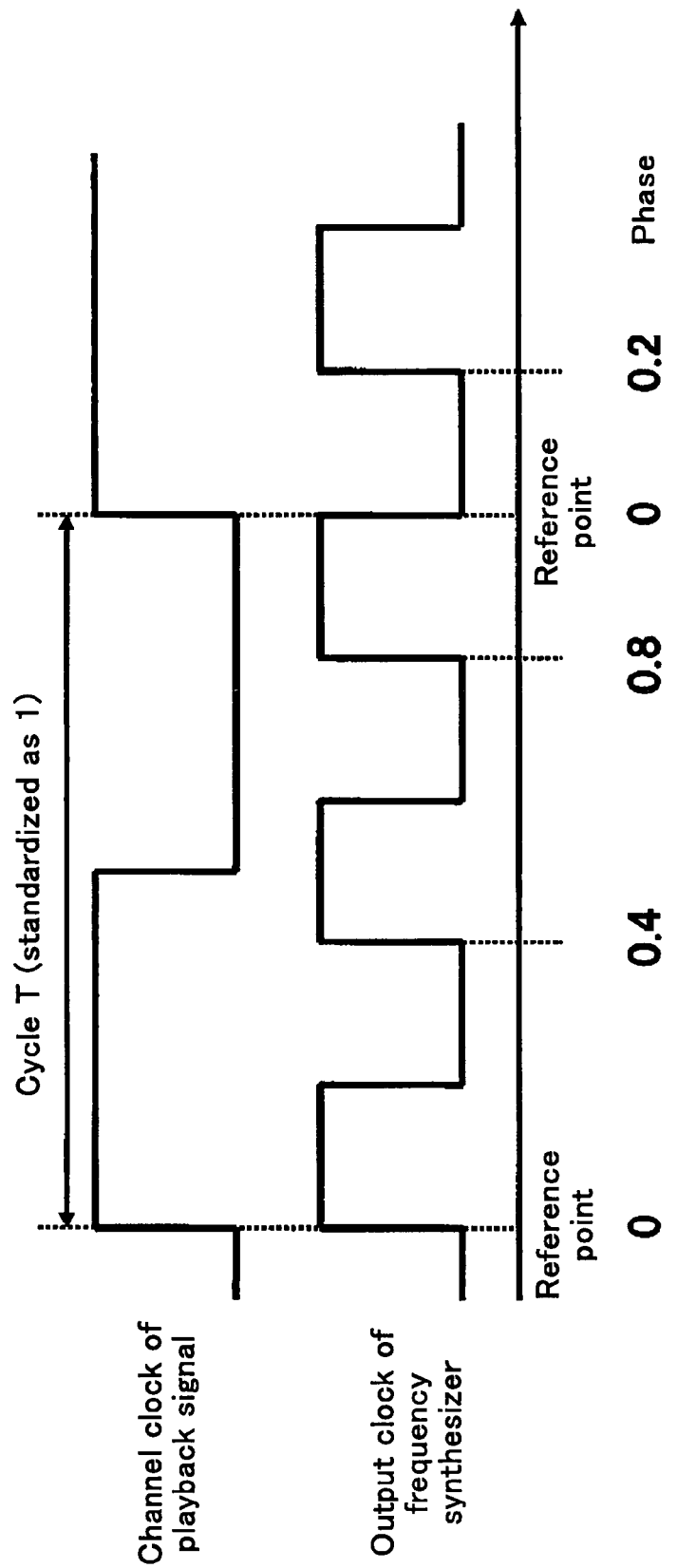
FIG. 5 is a view indicating the phase state of the output clock of a frequency synthesizer 6 standardized in accordance with channel bit cycle.
Figure 6:
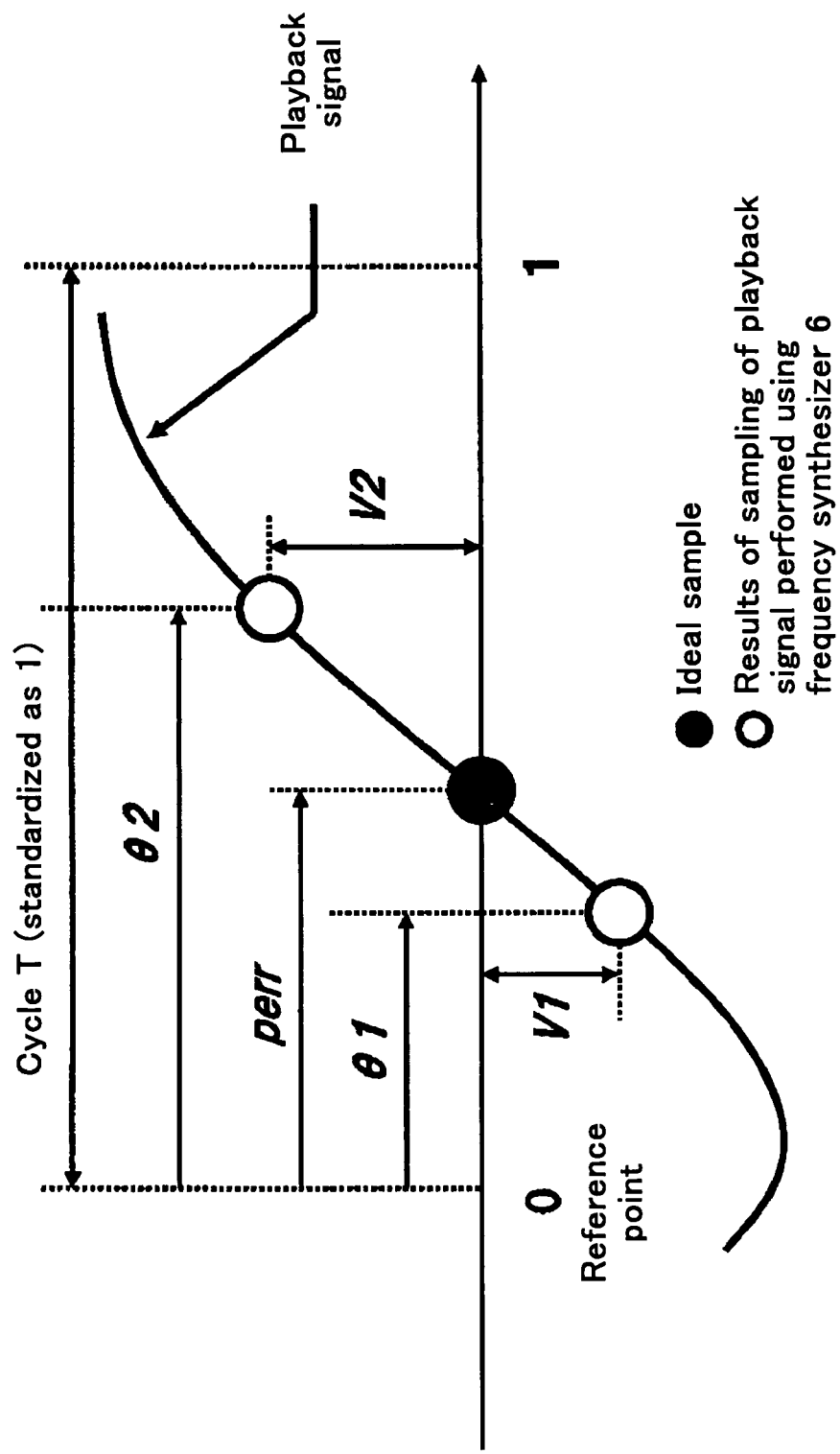
FIG. 6 is a view indicating relationships between the amount of correction obtained by a phase correction amount calculation section 3 and samples output from an A/D converter 1.

FIG. 5 shows a timing chart for the channel clock of the playback signal and the output clock of the frequency synthesizer 6. In FIG. 5, the reference edges are aligned, and the frequency of the output clock of the frequency synthesizer 6 is 2.5 times the playback frequency (the playback rate) of the playback signal. As shown in FIG. 5, where the playback cycle of the playback signal is 1, the phase state of the output clock of the frequency synthesizer 6 varies from 0.4 to 0.8 and then to 0.2 (the actual value would be 1.2, but when the channel bit cycle of the playback signal is used as the reference, a value of 0.2 is obtained by the equation 1.2−1=0.2). In an actual system, since the edges of the output clock of the frequency synthesizer 6 do not agree with the reference points in most cases, phase correction needs to be performed. For a phase error, as shown in FIG. 6, a phase error value perr, which is the distance from the reference value to the zero cross point of the playback signal, may be calculated. In FIG. 6, since the ratio between the playback frequency (the playback rate) of the playback signal and the frequency of the output clock of the frequency synthesizer 6 is known, it is possible to calculate the phases $\theta 1$ and $\theta 2$ of two sample values located before and after the zero cross point of the playback signal. Also, voltage values V1 and V2 obtained when the phases are $\theta 1$ and $\theta 2$ are the output results of the A/D converter 1 and are thus already known. Therefore, the phase error value perr is expressed by $$perr = \frac{\theta 2 \times |V1| + \theta 1 \times |V2|}{|V1| + |V2|} \quad \text{(Equation 1)}$$

(where $\theta 2 > \theta 1$). The phase error value perr is expressed as a value standardized with the playback cycle of the playback signal being 1. The phase error value perr may be calculated by another calculation method. In this manner, the phase correction amount calculation section 3 calculates the amount of phase correction for the playback signal with respect to the output clock of the frequency synthesizer 6.

Figure 7:
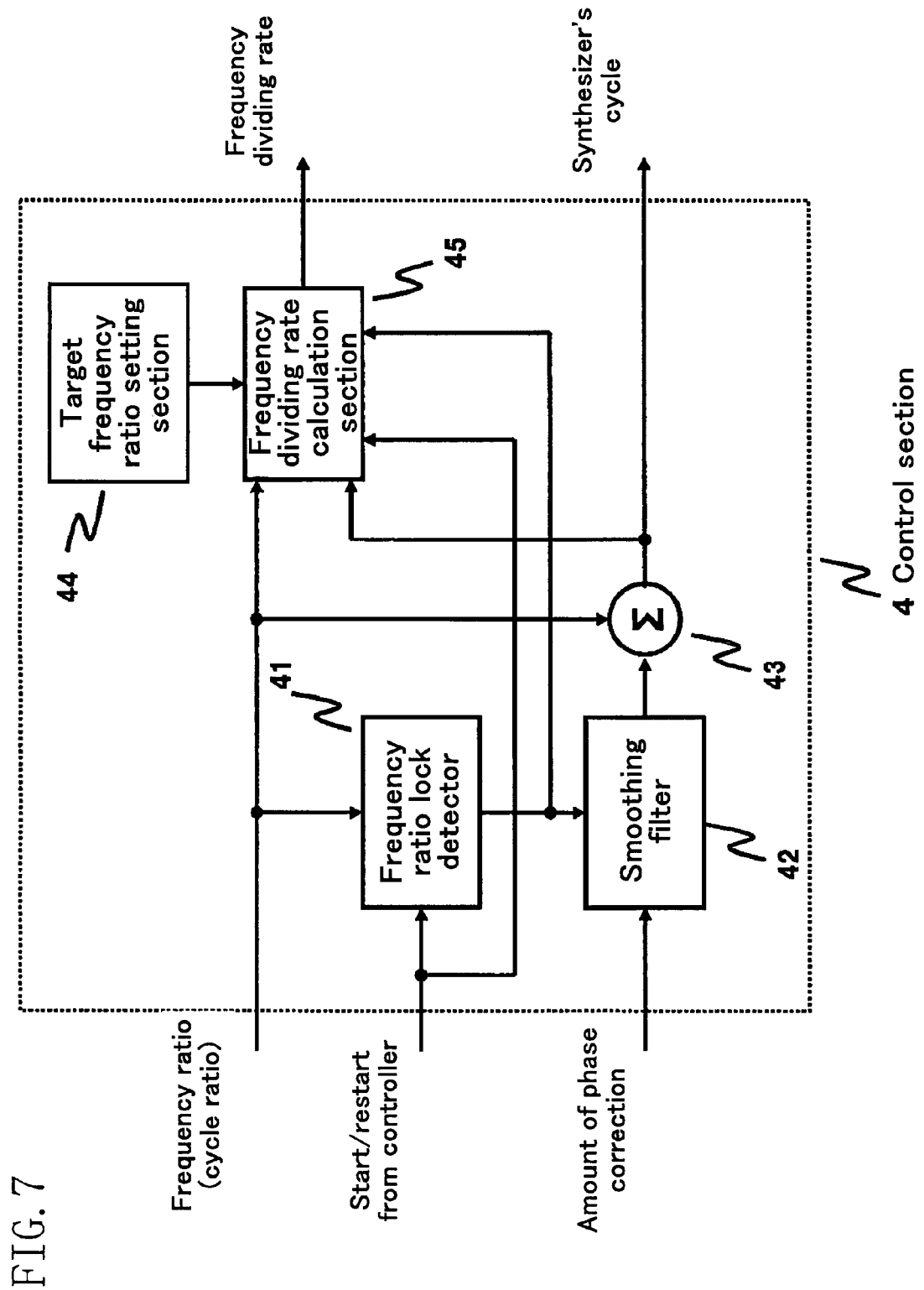
FIG. 7 is a block diagram of a control section 4 illustrated in FIG. 1.

The control section 4 receives the output of the frequency ratio calculation section 2 and the output of the phase correction amount calculation section 3 and generates two control signals; one is the frequency dividing rate of the frequency synthesizer 6, and the other, which is output to the pseudo-synchronous clock generation section, is the cycle of the output clock of the frequency synthesizer 6 with respect to the playback cycle of the playback signal. This cycle is a value indicating the current cycle value of the output clock of the frequency synthesizer 6 when the channel bit cycle is 1. FIG. 7 illustrates an example of the structure of the control section 4. In the structure shown in FIG. 7, a frequency ratio lock detector 41 detects whether or not the frequency ratio has become steady after the input of a start/restart signal. The start/restart signal is a control signal output from a system controller (not shown). A smoothing filter 42 is a filter for smoothing the amount of phase correction.

Figure 8:
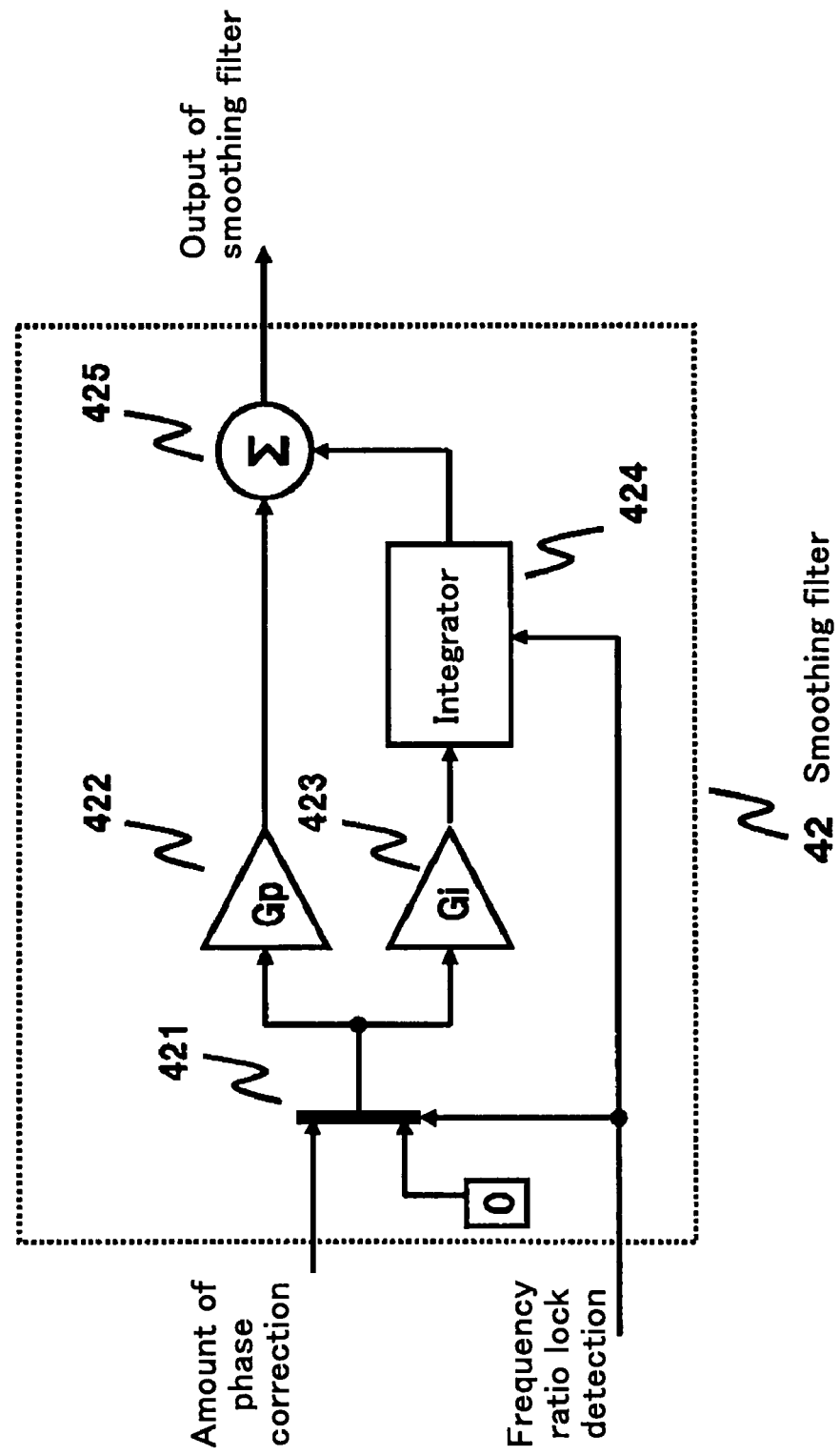
FIG. 8 is a block diagram of a smoothing filter 42 illustrated in FIG. 7.

The smoothing filter 42 may have a structure shown in FIG. 8, for example, which includes a portion for a performing proportional operation and a portion for performing an integral operation. In FIG. 8, before the frequency lock detection is performed, the output of a selector 421 is 0 and an integrator is reset to 0, whereby the output of this block is 0. After the frequency lock detection, the amount of phase correction is input to a proportional term and an integral term, and then an operation is performed for each term. The proportional term is multiplied by a gain Gp by a multiplier 422, while the integral term is multiplied by Gi by a multiplier 423 and then integrated by the integrator 424. An adder 425 adds these terms together, and then the addition result is output as the output of the smoothing filter 42 to an adder 43 which is connected to the next stage.

Figure 9:
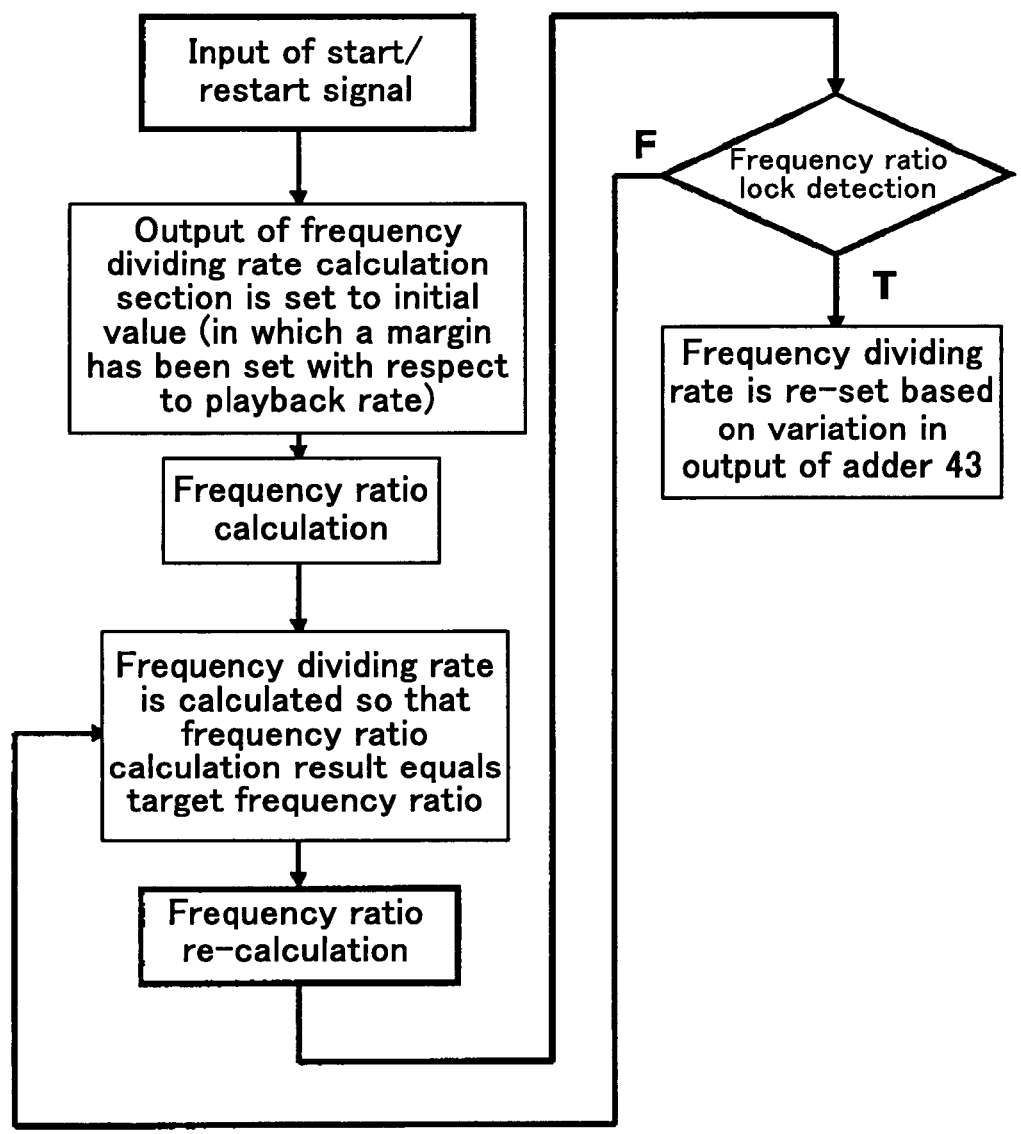
FIG. 9 is a view indicating operation process in the control section illustrated in FIG. 7.

Thereafter, in the control section 4 shown in FIG. 7, the adder 43 adds the frequency ratio from the frequency ratio calculation section 2 and the output of the smoothing filter 42 together, and outputs the current cycle (i.e., the value standardized with the channel bit cycle being 1) of the output clock of the frequency synthesizer 6. In a target frequency ratio setting section 44, a target frequency ratio for the frequency ratio between the frequency of the output clock of the frequency synthesizer 6 and the playback frequency of the playback signal is set. This target frequency ratio is set in advance in such a manner that the frequency of the output clock of the frequency synthesizer 6 never falls below a predetermined frequency. A frequency dividing rate calculation section 45 calculates the frequency dividing rate of the frequency synthesizer 6 based on information on the frequency ratio calculated by the frequency ratio calculation section 2 and on the target frequency ratio in the target frequency ratio setting section 44. FIG. 9 shows operation process in the control section 4 for the frequency dividing rate calculation. In this process, in which the frequency dividing rate is calculated so that the frequency ratio calculation result equals the target frequency ratio, the following equations hold where the current frequency ratio is N2 (=(the current frequency of the frequency synthesizer 6/the playback rate)), the frequency dividing rate of the frequency synthesizer 6 at this time is DIV1, the target frequency ratio is N2, and the frequency dividing rate of the frequency synthesizer 6 at this time is DIV2.

$$N1 \times DIV1 = N2 \times DIV2 \quad \text{(Equation 2)}$$

$$DIV2 = \frac{N1 \times DIV1}{N2} \quad \text{(Equation 3)}$$

Thus, the frequency dividing rate of the frequency synthesizer 6 may be set by the equation 3. In FIG. 9, after the frequency ratio lock detection, the frequency dividing rate is set again based on variation in the output of the adder 43. However, the same effects are also attainable in cases in which the frequency dividing rate of the frequency synthesizer 6 is recalculated only by using variation in the output of the smoothing filter 42 or variation in the frequency ratio. Also, the frequency dividing rate calculation section may be controlled so that the frequency dividing rate is set again only when the variation exceeds a predetermined threshold value.

Figure 10:
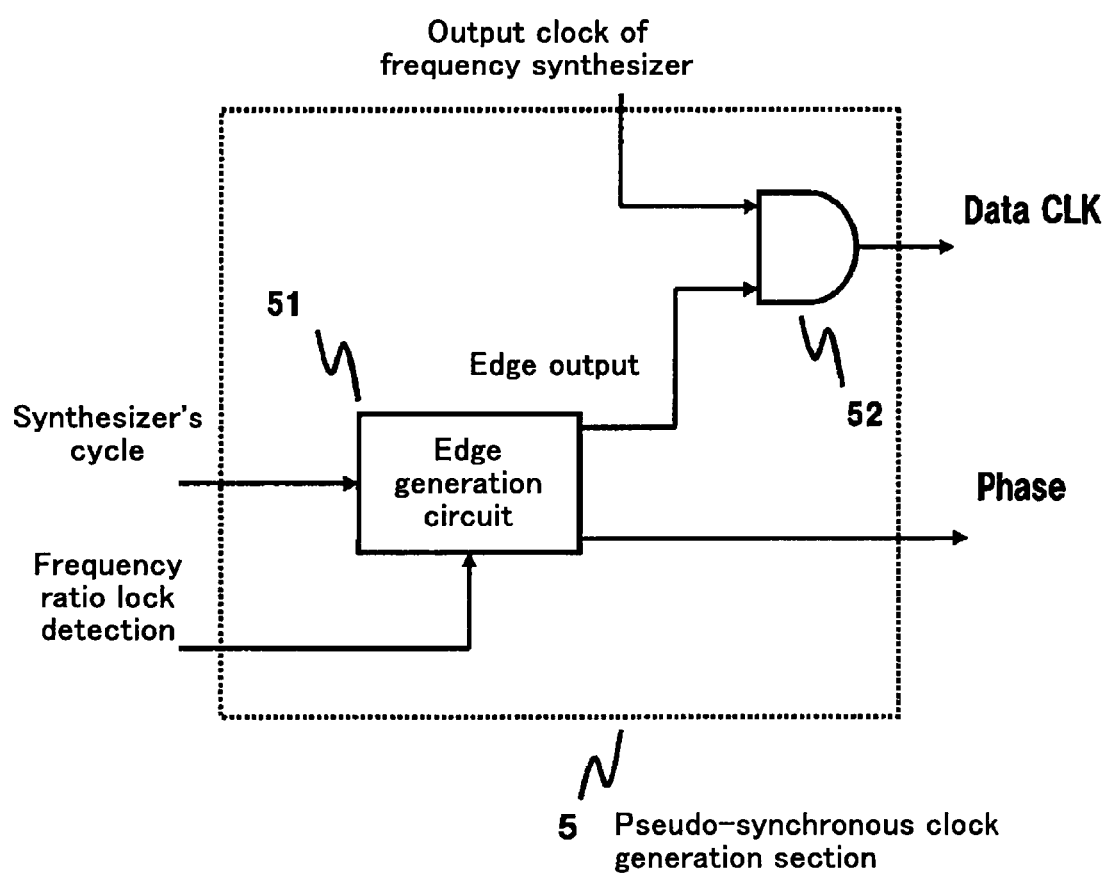
FIG. 10 is a block diagram of a pseudo-synchronous clock generation section 5.
Figure 11:
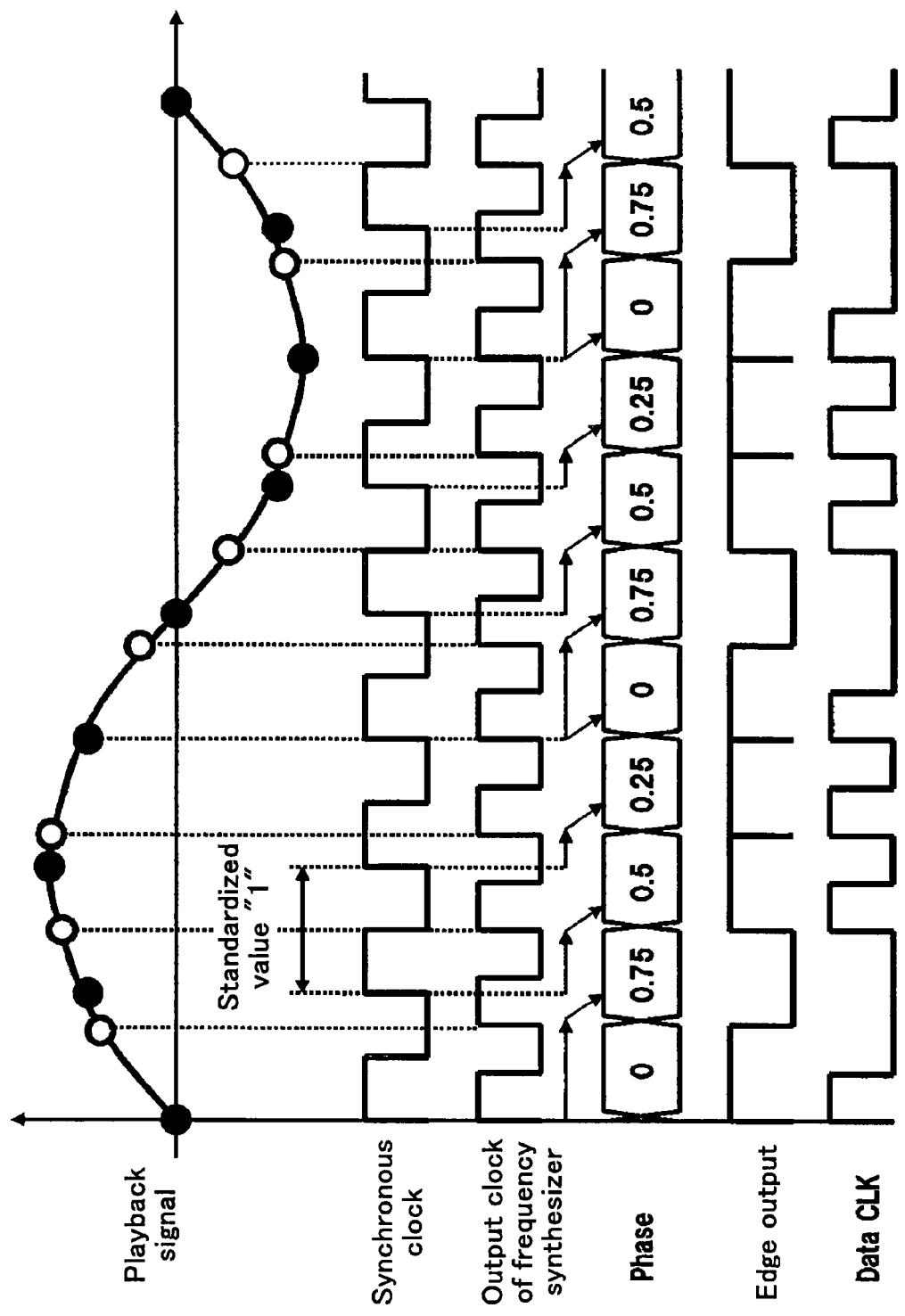
FIG. 11 is a view indicating a timing chart for the pseudo-synchronous clock generation section 5.

FIG. 10 illustrates the structure of the pseudo-synchronous clock generation section 5. The synthesizer's cycle, which is the output of the control section 4, is input into an edge generation circuit 51. An AND circuit 52 performs an AND operation on the output of the edge generation circuit and the output clock of the frequency synthesizer 6, and outputs the results as a data clock. The edge generation circuit 51 performs a mod1 operation on the incoming synthesizer's cycle. To be specific, the edge generation circuit 51 accumulates the incoming synthesizer's cycle. In this accumulation process, if the operation result exceeds "1", the value obtained by subtracting "1" from the operation result is considered as the result of the accumulation. For instance, an example shown in FIG. 11 shows a case in which the ratio between the frequency of the frequency synthesizer and the frequency of the playback rate is 1.33 (the cycle ratio is 0.75 when calculated with the cycle of the playback rate being 1). In this case, the synthesizer's cycle has a constant value of 0.75. Thus, the edge generation circuit 51 performs the accumulation process of adding 0.75 in synchronization with the output clock of the frequency synthesizer 6. In this process, the results of mere accumulations would be 0, 0.75, 1.5, . . . . However, the mod 1 operation is performed in each accumulation, and the mod 1 operation results Phase are 0, 0.75, 0.5 (since a value of 1.5 exceeds 1, the result obtained by subtracting 1 from 1.5 is the mod 1 operation result) . . . . When such subtraction processing is performed in the mod 1 operation, the edge output is HI. Data CLK is the result obtained by performing an AND operation on the edge output and the output clock of the frequency synthesizer 6.

Figure 12:
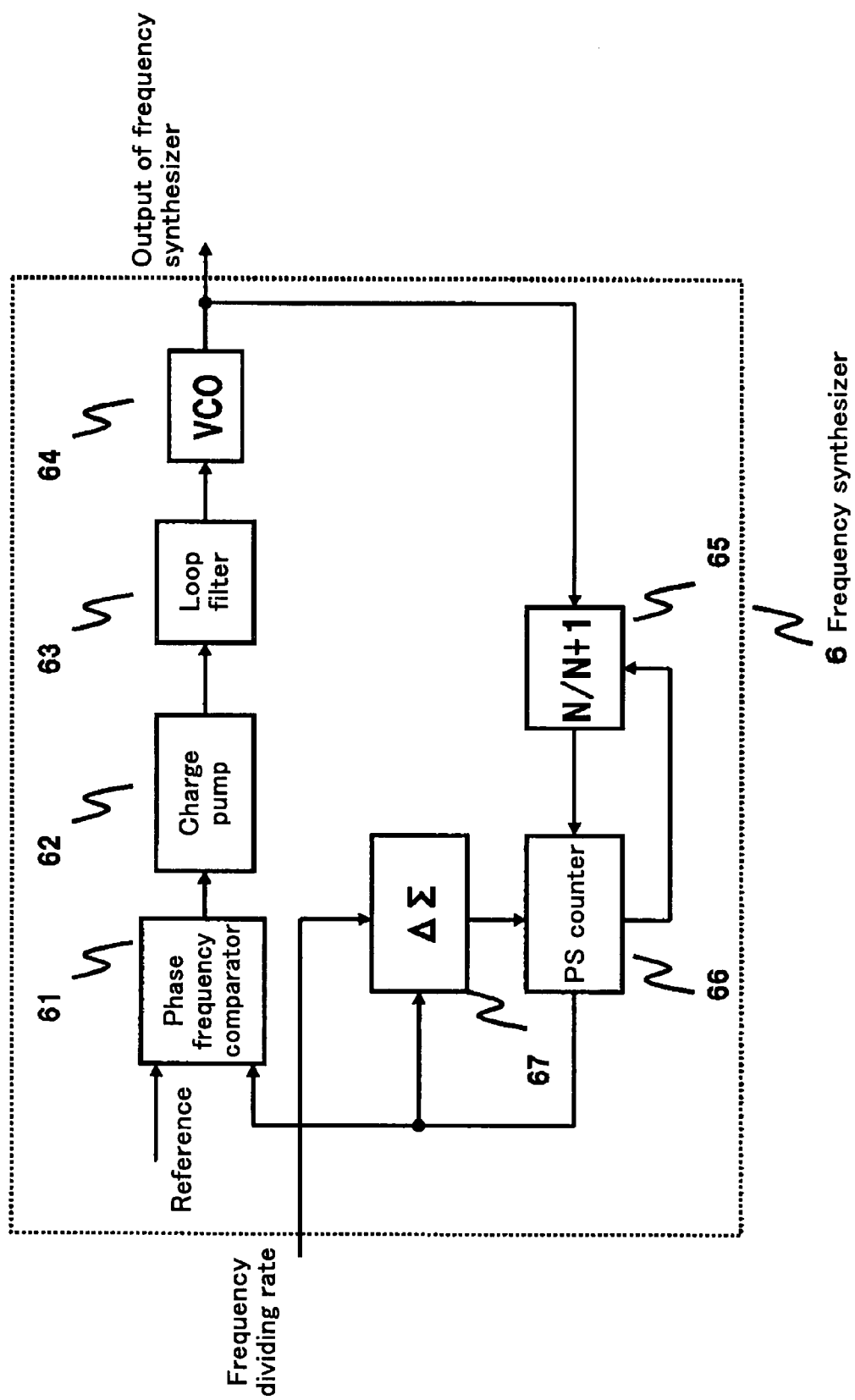
FIG. 12 is a view illustrating an example of the structure of the frequency synthesizer 6 illustrated in FIG. 1.

Next, FIG. 12 illustrates an example of the structure of the frequency synthesizer 6. The frequency synthesizer 6 illustrated in FIG. 12 is a fractional frequency division frequency synthesizer. The reference numeral 61 refers to a phase frequency comparator for comparing the phases/frequencies of a reference signal and of a signal obtained by modulation of the output clock of the frequency synthesizer; 62 to a charge pump; 63 to a loop filter; 64 to a VCO; 65 to a frequency divider for dividing the frequency of the output of the VCO 64 by N/N+1; 66 to a pulse swallow counter; and 67 to a ΔΣ modulator. By using this structure, it is possible to set the frequency of the output clock of the frequency synthesizer to a value corresponding to the incoming frequency dividing rate (consisting of an integer portion and a fraction portion).

In this embodiment, the fractional frequency division frequency synthesizer is used as the clock generation section. In a case where a clock generation section, composed of an oscillator, a frequency divider, and a modulator, is used instead, the same effects are also achievable. In that case, a modulation signal generated by the modulator is changed in accordance with the input frequency dividing rate, and the changed modulation signal is used as the frequency dividing rate. It is common to use a ΔΣ modulator as this modulator.

Figure 13:
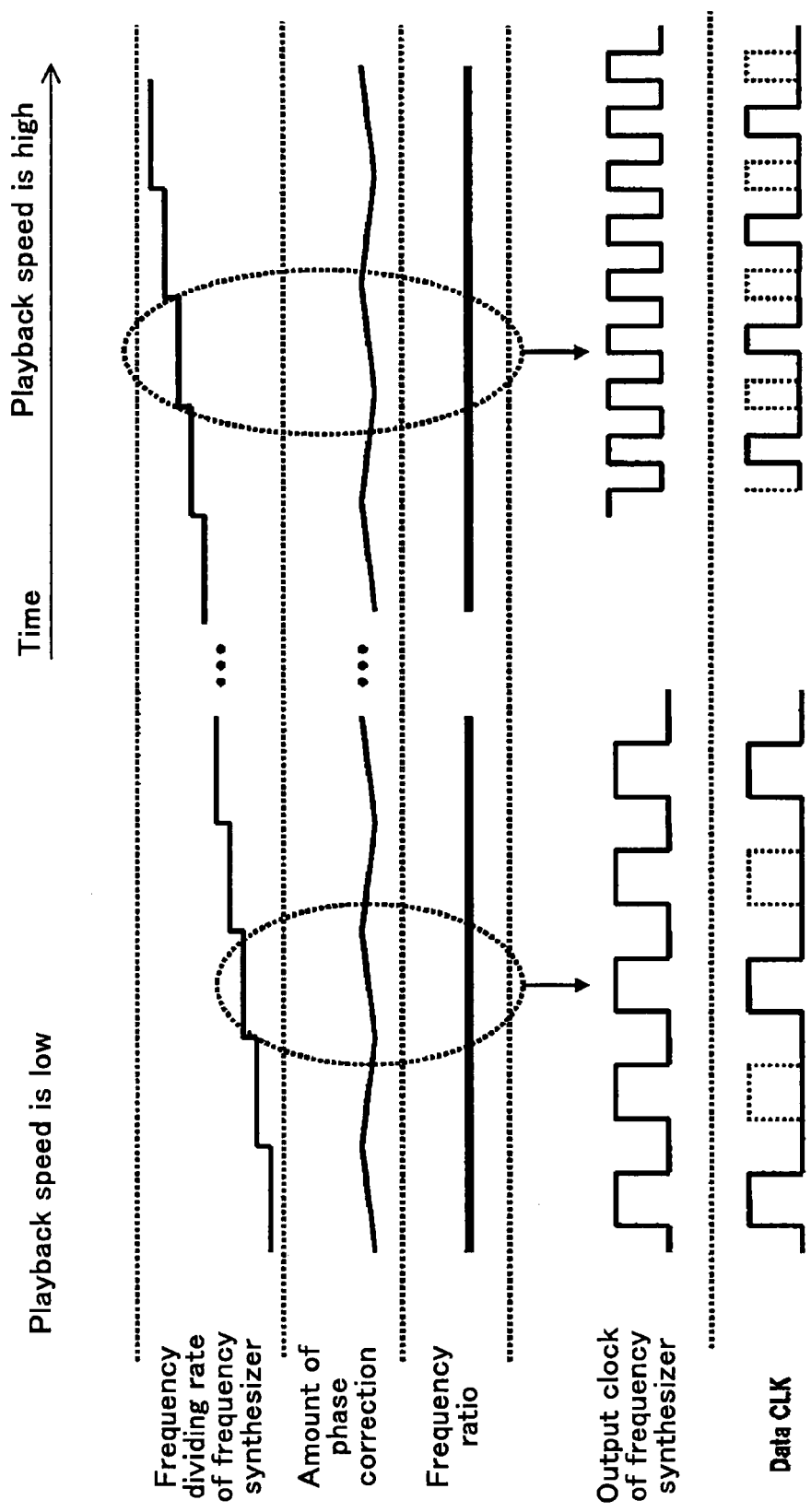
FIG. 13 is a view indicating a timing chart for the timing extractor illustrated in FIG. 1.

FIG. 13 is a timing chart for this type of timing extractor when the playback frequency (the playback rate) of a playback signal changes. In this way, the ratio between the playback frequency (the playback rate) of the playback signal and the frequency of the frequency synthesizer 6 is controlled so as to be constant (or to be within a certain range) in accordance with the frequency dividing rate of the frequency synthesizer 6 and the playback frequency (the playback rate) of the playback signal, whereby the decimation intervals in Data CLK with respect to the output clock of the frequency synthesizer 6 can be set constant (or within a certain range).

FIGS. 14 to 18 are block diagrams indicating modified examples of the timing extractor of the first embodiment of the present invention.

Figure 14:
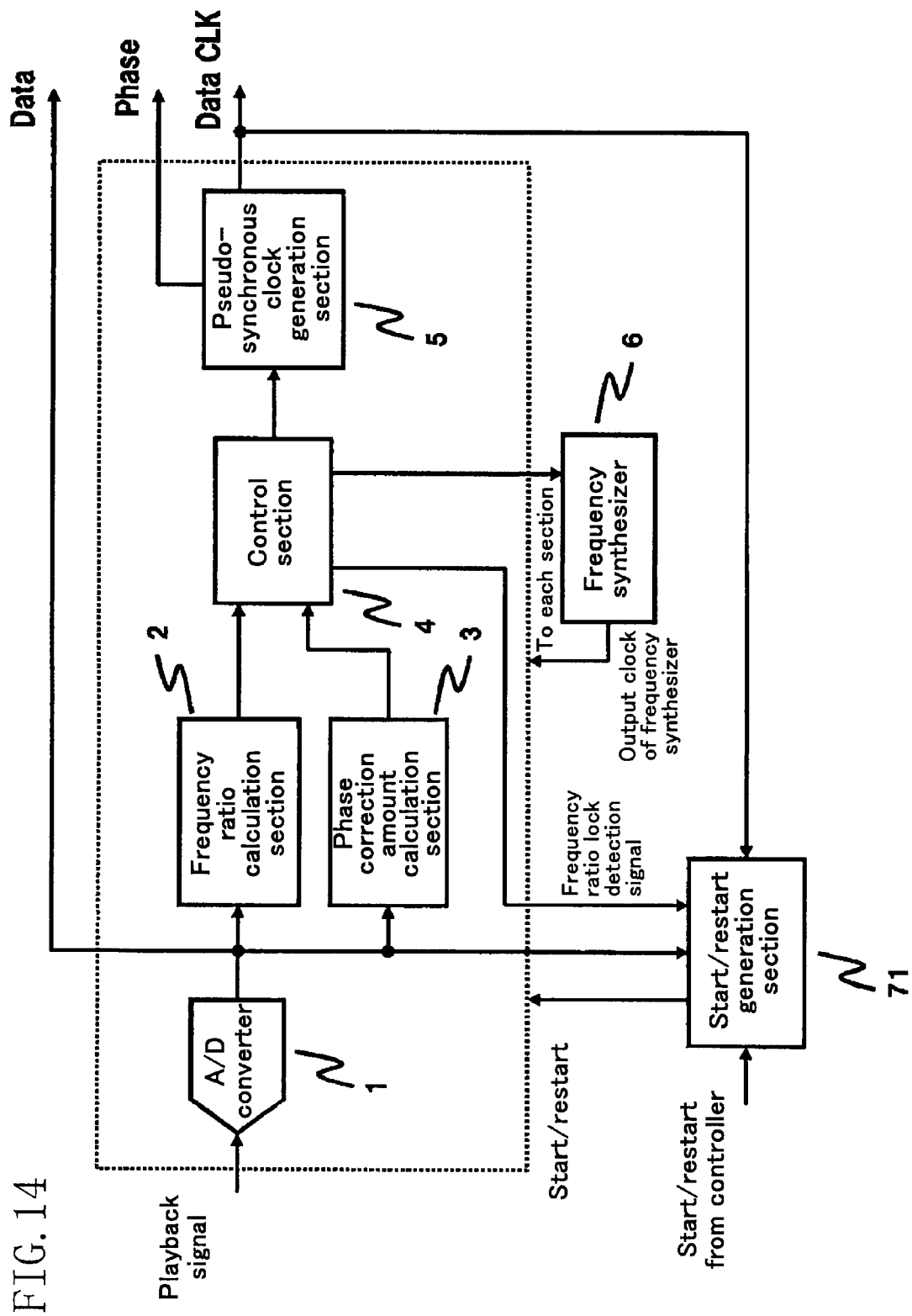
FIG. 14 is a block diagram illustrating a modified example of the timing extractor illustrated in FIG. 1.

In the timing extractor shown in FIG. 1, the start/restart signal is input from the controller (not shown). In FIG. 14, however, a start/restart signal is not directly input but is generated through a start/restart signal generation section (a restart signal generation section) 71. After detection of a frequency ratio lock detection signal output from the control section 4, the start/restart signal generation section 71 re-samples the output sequence of the A/D converter 1 by Data CLK, and checks whether or not a sync mark or an interval between two consecutively appearing sync marks is equal to an ideal value obtained when the sync mark or the sync mark appearing interval is measured using a synchronous clock, and also checks whether or not the sync mark or the sync mark appearing interval has been detected correctly. If the sync mark or the sync mark appearing interval exceeds a predetermined value consecutively for a predetermined number of times, the start/restart signal generation section 71 generates a start/restart signal so that the frequency dividing rate of the frequency synthesizer 6 is set again.

Figure 15:
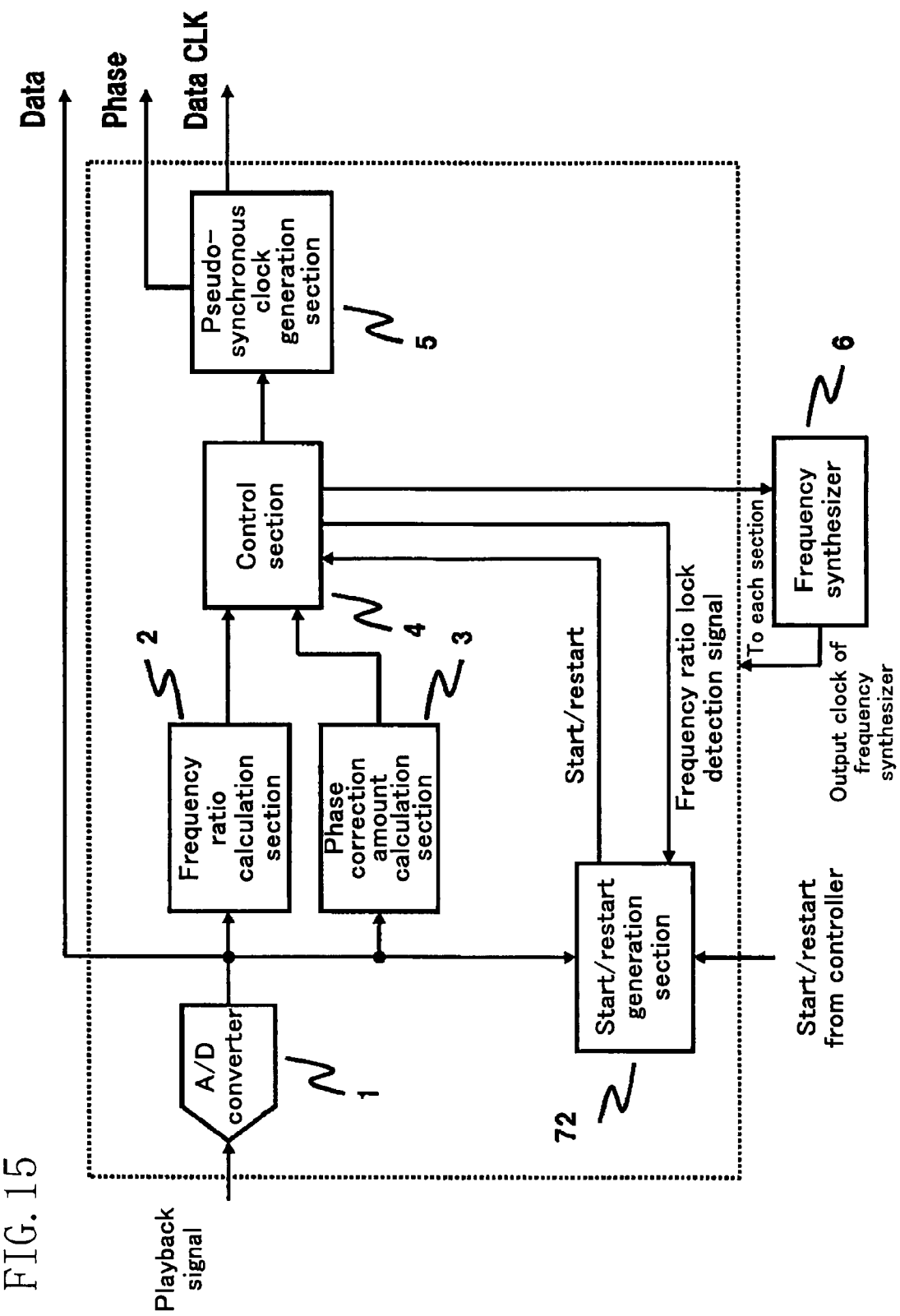
FIG. 15 is a block diagram illustrating another modified example of the timing extractor illustrated in FIG. 1.

In the timing extractor shown in FIG. 1, the playback processing start/restart signal is input from the controller (not shown). In FIG. 15, however, a start/restart signal is input into a start/restart signal generation section 72, and a new start/restart signal is generated through the start/restart signal generation section 72. After detection of a frequency ratio lock detection signal output from the control section 4, the start/restart signal generation section 72 samples the output sequence of the A/D converter 1 by the output clock of the frequency synthesizer 6 and checks whether or not a sync mark or a sync mark appearing interval has been detected correctly. If the sync mark or the sync mark appearing interval exceeds a predetermined value consecutively for a predetermined number of times, the start/restart signal generation section 72 generates a start/restart signal so that the frequency dividing rate of the frequency synthesizer 6 is set again.

The start/restart signal generation sections 71 and 72 shown in FIGS. 14 and 15 may be configured so as to generate a restart signal when the frequency ratio of the frequency ratio calculation section 2 exceeds a predetermined value consecutively for a predetermined number of times.

Figure 16:
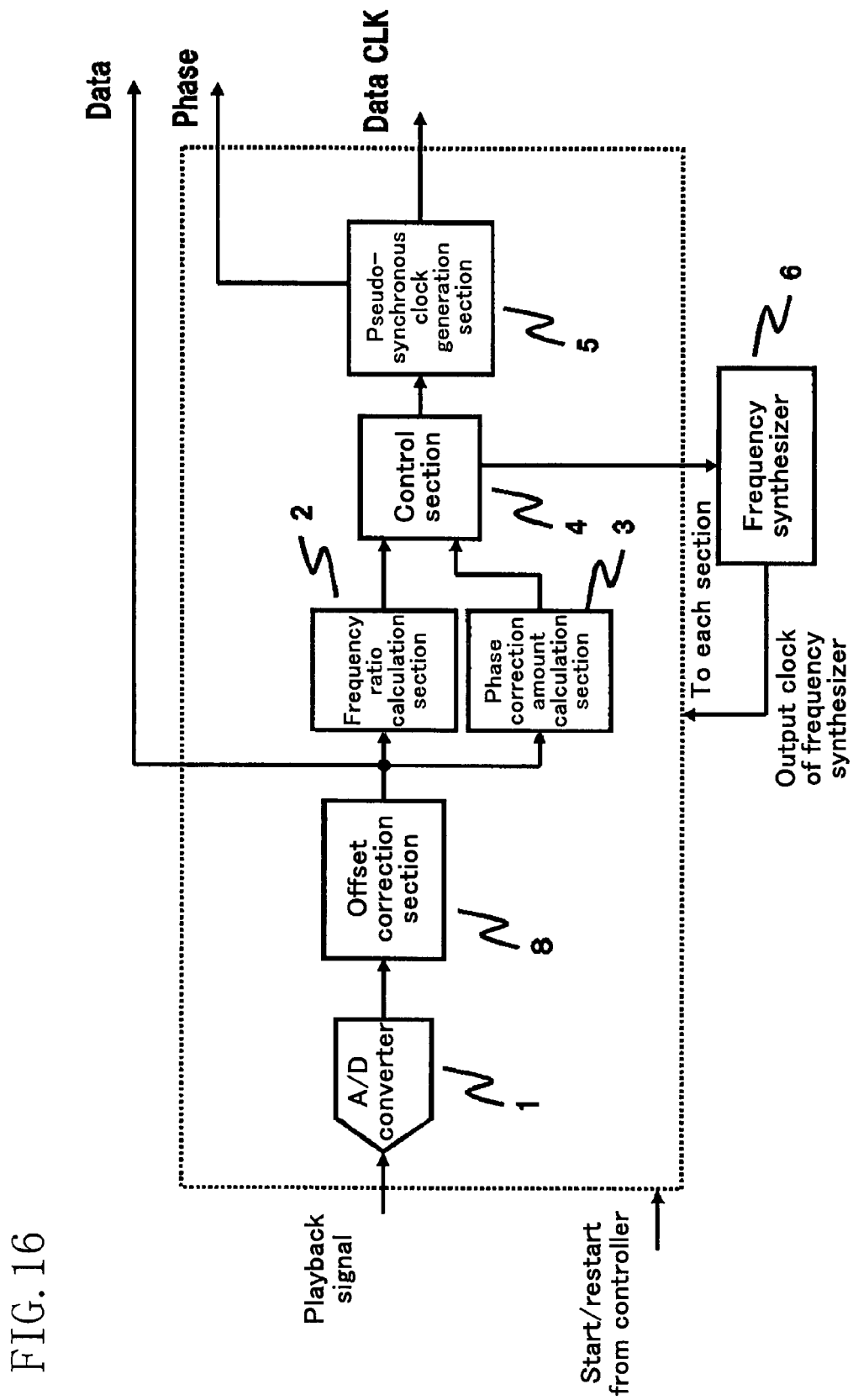
FIG. 16 is a block diagram illustrating another modified example of the timing extractor illustrated in FIG. 1.

In a structure shown in FIG. 16, an offset correction section 8 is additionally connected to the output stage of the A/D converter 1 in the timing extractor shown in FIG. 1, so that a timing extraction operation is performed after an offset in a playback signal is corrected.

Figure 17:
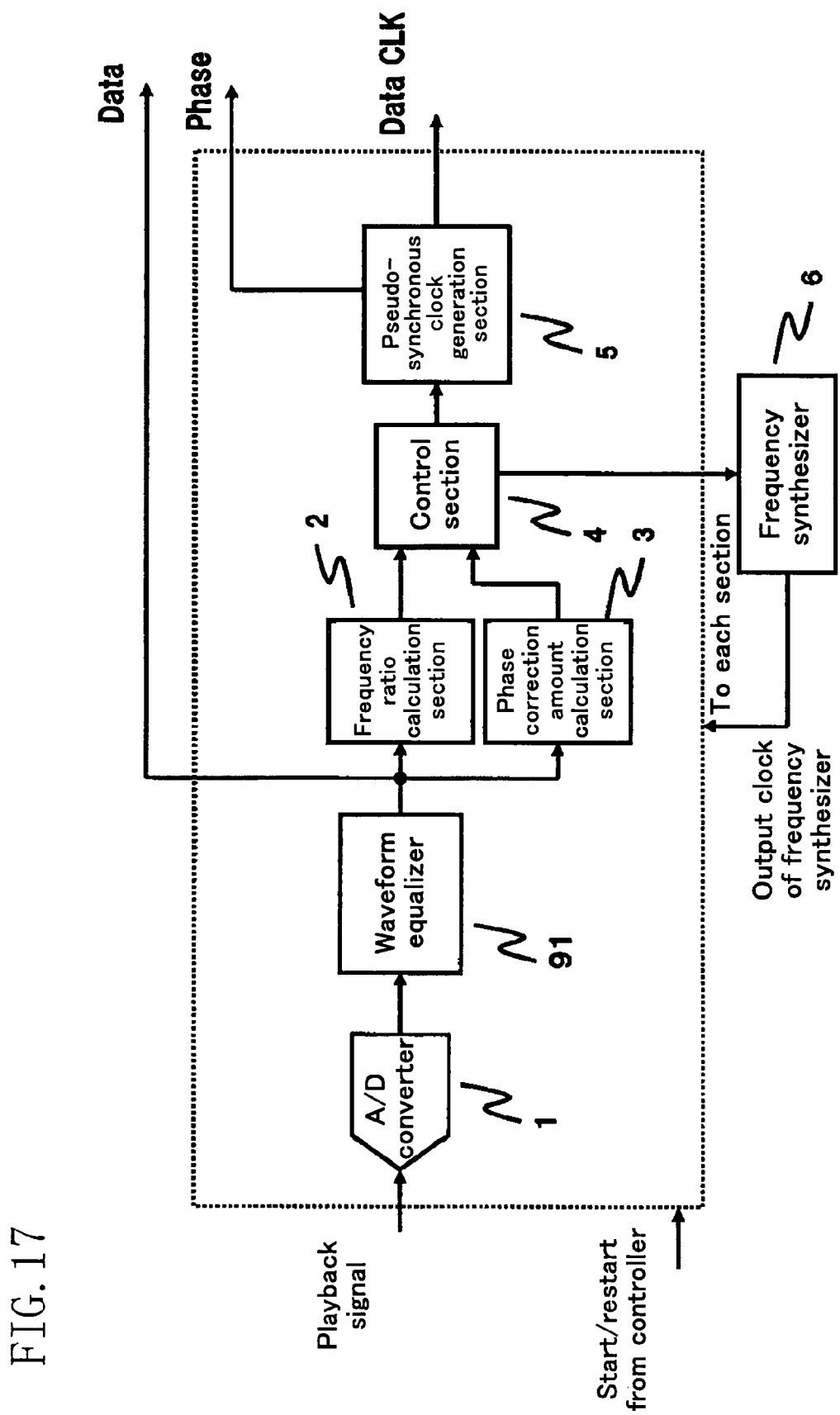
FIG. 17 is a block diagram illustrating still another modified example of the timing extractor illustrated in FIG. 1.

In a structure shown in FIG. 17, a digital waveform equalizer 91 is additionally connected to the output stage of the A/D converter 1 in the timing extractor shown in FIG. 1, so that a timing extraction operation is performed after the waveform of a playback signal is equalized in the digital region. In this structure, control is performed so that the ratio between the playback frequency (the playback rate) of the playback signal and the frequency of the output clock of the frequency synthesizer 6 is always constant or within a certain range. Therefore, once coefficient control of the digital waveform equalizer 91 has been determined, the frequency characteristics are kept substantially the same even if the playback rate varies, and thus the control is very simplified.

Figure 18:
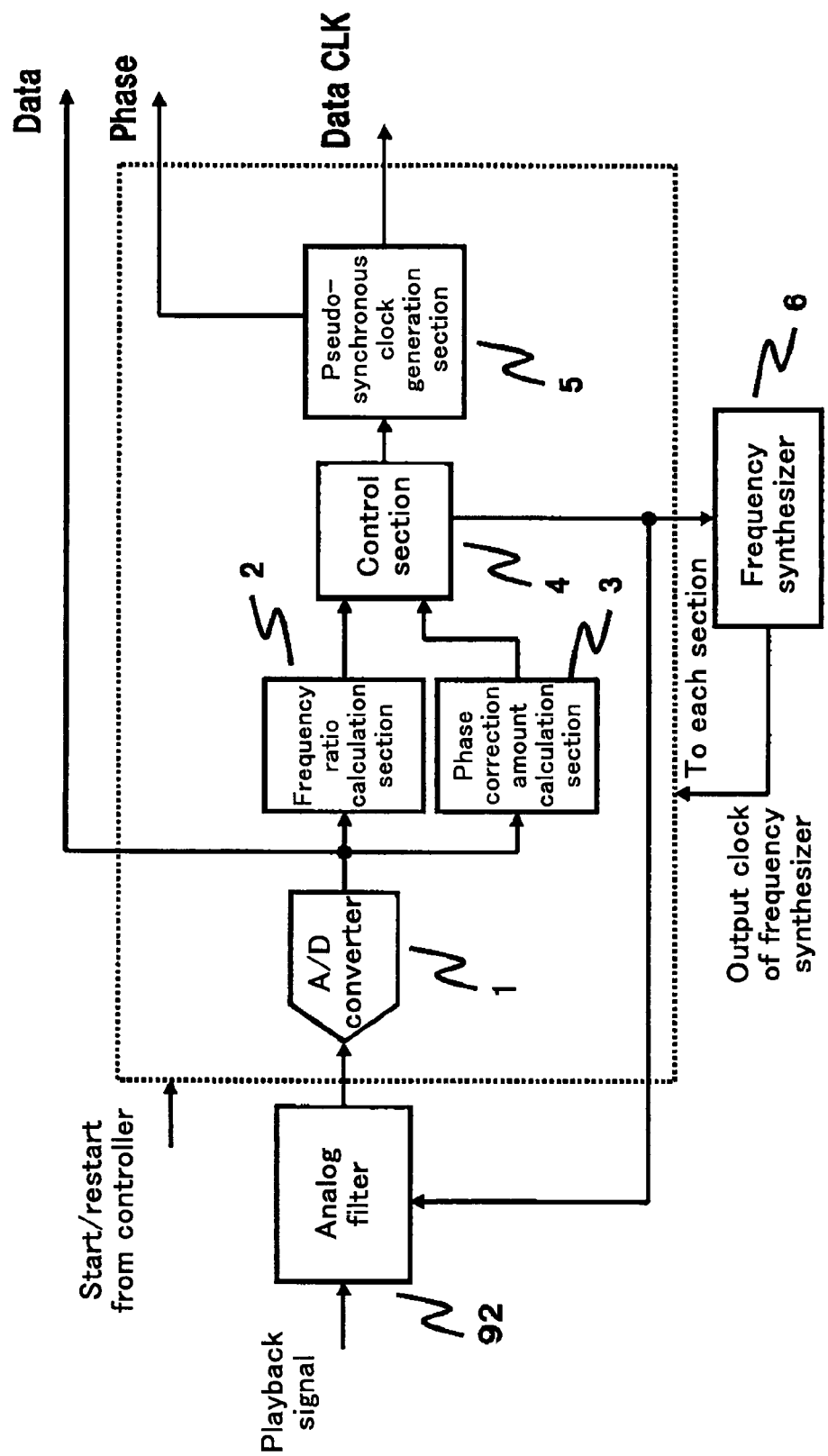
FIG. 18 is a block diagram illustrating yet another modified example of the timing extractor illustrated in FIG. 1.

In a structure shown in FIG. 18, an analog filter 92 is additionally connected to the stage before the A/D converter 1 in the timing extractor shown in FIG. 1, so that a timing extraction operation is performed after waveform equalization processing or high-frequency noise removal processing on a playback signal is performed in the analog region. Where the playback frequency (the playback rate) of the playback signal varies, the filter characteristics of the analog filter 92 need to be adjusted according to that variation. In the structure of this modified example, since the equalization characteristics or cutoff characteristics of the analog filter 92 can be adjusted in accordance with the frequency dividing rate of the frequency synthesizer 6 that is output from the control section 4, the control can be very simplified.

Figure 19:
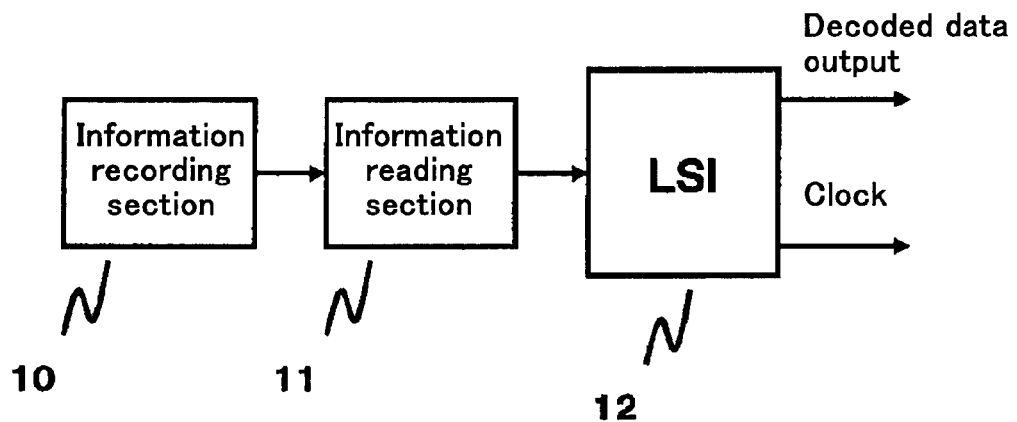
FIG. 19 is a block diagram schematically illustrating the entire structure of an information playback apparatus including the timing extractor illustrated in FIG. 1.
Figure 20:
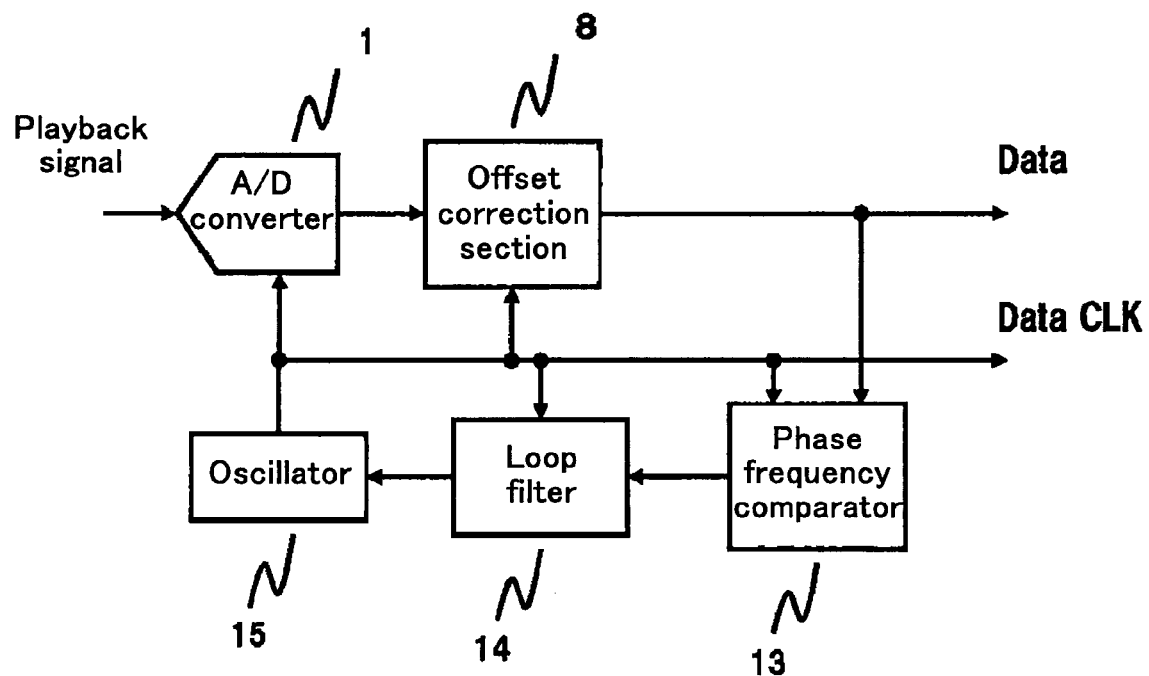
Figure 21:
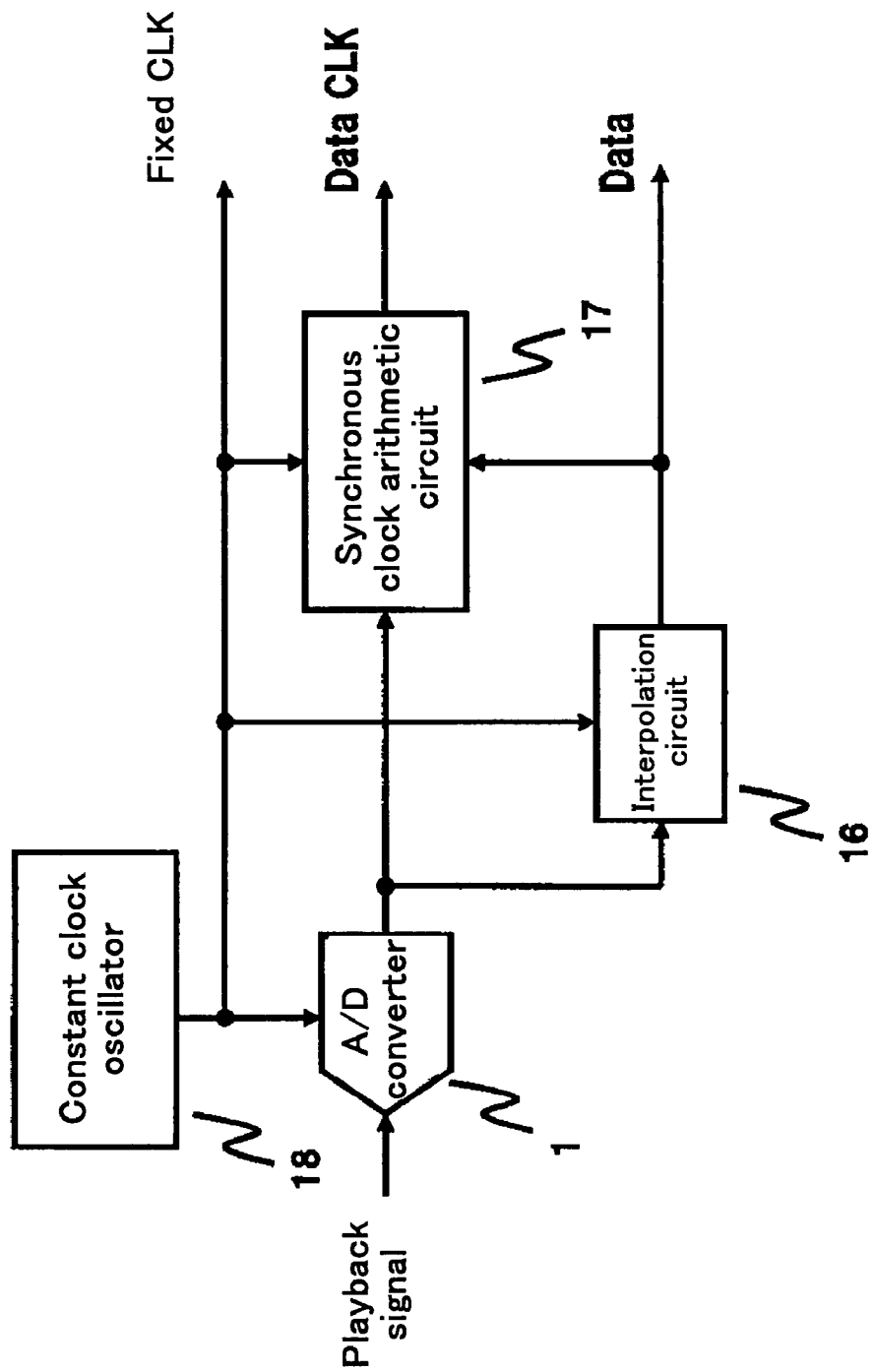
Figure 22:
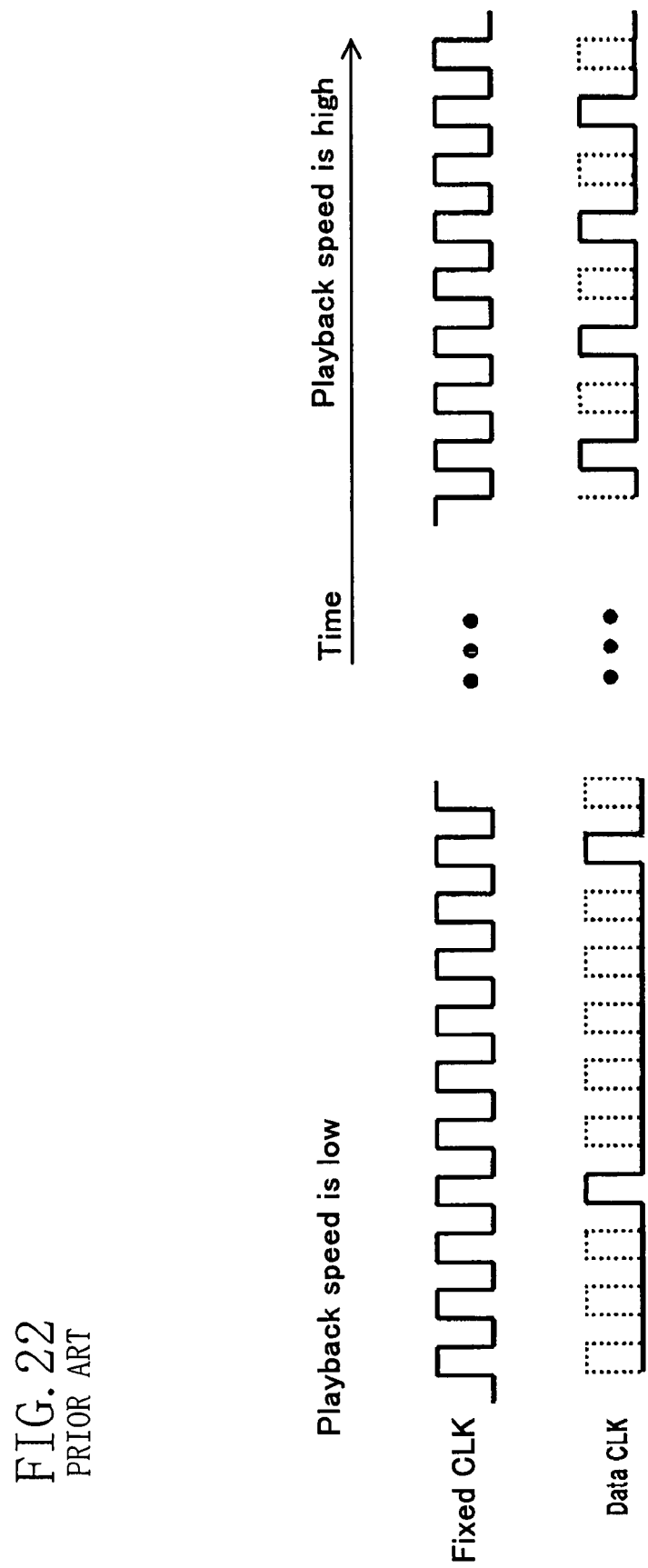
FIG. 22 is a view indicating a timing chart for a circuit shown in FIG. 21.

FIG. 19 is a block diagram schematically illustrating the entire structure of an information playback apparatus including an LSI 12 having the timing extractor of this embodiment therein. Now, the information playback apparatus will be described as a DVD playback device or the like; an information recording section 10 is a recording medium (a DVD medium), an information reading section 11 is a pickup for reading recorded data from the recording medium, and the LSI 12 includes a signal processing circuit (not shown) for performing waveform equalization, error correction, data modulation, etc. by using the waveform of a playback signal read by the pickup. Decoded data and a pseudo-synchronous clock that are output from the LSI 12 are used to display information or to convert information into sound.

In the examples in the foregoing description, timing information contained in a playback signal from a recording medium such as a DVD is extracted. However, the present invention is also applicable to cases in which timing information contained in a signal supplied through a radio communication path or a wire communication path, such as an optical fiber, a coaxial cable, or an electric power line, is extracted.

Furthermore, it will easily be appreciated that the timing extractors according to the present invention may be configured so that timing information is extracted by performing, by software, the control of the frequency dividing rate setting in the target frequency ratio setting section 44 and in the frequency dividing rate calculation section 45 included in the control section 4 shown in FIG. 7, for example.

INDUSTRIAL APPLICABILITY

As described above, according to the present invention, in the feedforward timing extractors, the ratio between the playback frequency (the playback rate) of a playback signal and the frequency of the output clock of the clock generation section (the frequency synthesizer) is controlled so as to have a desired value (i.e., a constant value, or a value within a predetermined range), whereby the system's power consumption can be optimized and the control can be simplified. The inventive timing extractors are thus applicable to information playback apparatuses for extracting timing information from a playback signal, e.g., timing extractors for optical disks.

The invention claimed is:

1. A timing extractor in an information playback apparatus for extracting data and recording timing of the data from a playback signal, the timing extractor comprising:
   a clock generation section for generating a clock according to a set frequency dividing rate and outputting the generated clock;
   quantization means for quantizing the playback signal in accordance with timing of the output clock of the clock generation section and outputting the quantized signal;
   a frequency ratio calculation section for measuring either a specific pattern or an interval between two consecutively appearing specific patterns contained in an output sequence of the quantized signal from the quantization means, or both the specific pattern and the specific pattern appearing interval, in accordance with the output clock of the clock generation section, and calculating, based on a value obtained by the measurement, a frequency ratio between a playback frequency of the playback signal and a frequency of the output clock of the clock generation section;
   a phase correction amount calculation section for calculating the amount of phase correction for the output clock of the clock generation section with respect to the quantized signal from the quantization means;
   a control section for receiving the frequency ratio calculated by the frequency ratio calculation section and the amount of phase correction calculated by the phase correction amount calculation section, and calculating and setting the frequency dividing rate of the clock generation section and a cycle of the output clock of the clock generation section with respect to a playback cycle of the playback signal; and
   a pseudo-synchronous clock generation section for eliminating, based on an output from the control section, pulses of the output clock of the clock generation section to generate a pseudo-synchronous clock that is synchronized with the recording timing of the recorded data in a pseudo-manner, the output of the control section being the cycle of the output clock of the clock generation section with respect to the playback cycle of the playback signal.

2. The timing extractor of claim 1, wherein where a playback processing start signal or a playback processing restart signal has been input, the control section sets the frequency dividing rate of the clock generation section in such a manner that the frequency ratio of the frequency ratio calculation section equals a predetermined value, and then the control section updates the frequency dividing rate of the clock generation section so that the frequency ratio of the frequency ratio calculation section is constant, in accordance with the amount of phase correction from the phase correction amount calculation section.

3. The timing extractor of claim 1, wherein where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section exceeds a predetermined threshold value, the control section updates the frequency dividing rate of the clock generation section in such a manner that the frequency ratio of the frequency ratio calculation section is equal to or smaller than the threshold value, by using the amount of phase correction from the phase correction amount calculation section.

4. The timing extractor of claim 1, wherein where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section varies, the control section updates the frequency dividing rate of the clock generation section so that the frequency ratio of the frequency ratio calculation section is constant.

5. The timing extractor of claim 1, wherein where a playback processing start signal or a playback processing restart signal has been input, the control section sets the frequency dividing rate of the clock generation section in such a manner that the frequency ratio of the frequency ratio calculation section equals a predetermined value, and thereafter, if the frequency ratio of the frequency ratio calculation section exceeds a predetermined threshold value, the control section updates the frequency dividing rate of the clock generation section so that the frequency ratio of the frequency ratio calculation section is equal to or smaller than the threshold value.

6. The timing extractor of claim 1, further comprising a restart signal generation section for, after playback processing is started, measuring the specific pattern appearing interval contained in the output sequence of the quantized signal from the quantization means in accordance with the pseudo-synchronous clock from the pseudo-synchronous clock generation section, comparing the measured specific pattern appearing interval with an ideal value obtained by measuring the specific pattern appearing interval in accordance with a synchronization clock, and, if the specific pattern appearing interval measured in accordance with the pseudo-synchronous clock exceeds a predetermined value consecutively for a predetermined number of times, generating a restart signal for updating the frequency dividing rate of the clock generation section.

7. The timing extractor of claim 1, further comprising a restart signal generation section for generating a restart signal, if, in a case where a playback processing start signal or a playback processing restart signal has been input, the frequency ratio of the frequency ratio calculation section exceeds a predetermined value consecutively for a predetermined number of times after the control section sets the frequency dividing rate of the clock generation section in such a manner that the frequency ratio of the frequency ratio calculation section equals the predetermined value.

8. The timing extractor of claim 1, wherein where a playback processing start signal or a playback processing restart signal has been input, the control section sets the frequency dividing rate of the clock generation section in such a manner that the frequency of the output clock of the clock generation section does not fall below a predetermined frequency.

9. The timing extractor of claim 1, wherein the control section uses the frequency ratio of the frequency ratio calculation section and results of smoothing processing performed on the amount of phase correction from the phase correction amount calculation section to calculate the playback cycle of the clock generation section with respect to the playback cycle of the playback signal and outputs the calculated playback cycle to the pseudo-synchronous clock generation section.

10. The timing extractor of claim 1, wherein where the output sequence of the quantized signal from the quantization means is converted into binary digits 0s and 1s, a ratio between successive 0s and successive 1s in the specific pattern is 14:4 or 4:14 when a medium where the data has been recorded is a DVD-ROM or a DVD-RAM, 11:11 when the medium is a CD, and 2:9:9 or 9:9:2 when the medium is a Blu-ray disc.

11. The timing extractor of claim 1, wherein if measured in accordance with the playback rate of the playback signal, the specific pattern appearing interval in the output sequence of the quantized signal from the quantization means is 1488 when a medium where the data has been recorded is a DVD-ROM or a DVD-RAM, 588 when the medium is a CD, and 1932 when the medium is a Blu-ray disc.

12. The timing extractor of claim 1, wherein an offset correction means for correcting an offset contained in the output of the quantization means is connected to the output of the quantization means, and
the frequency ratio calculation section and the phase correction amount calculation section operate using an output from the offset correction means instead of the output of the quantization means.

13. The timing extractor of claim 1, wherein a waveform equalization means for equalizing the waveform of the output of the quantization means in accordance with the output clock of the clock generation section is connected to the output of the quantization means, and
the frequency ratio calculation section and the phase correction amount calculation section operate using an output from the waveform equalization means instead of the output of the quantization means.

14. The timing extractor of claim 1, wherein an analog filter for performing waveform equalization processing or high-frequency noise removal processing on the playback signal is connected to an input of the quantization means, and
equalization characteristics or cutoff characteristics of the analog filter are varied in accordance with the frequency dividing rate of the clock generation section that is output from the control section.

15. The timing extractor of claim 1, wherein the frequency dividing rate of the clock generation section that is output from the control section has an integer portion and a fraction portion, and
the clock generation section is a frequency synthesizer capable of fractional frequency division control.

16. An information playback apparatus comprising:
the timing extractor of claim 1, and
a signal processing circuit for decoding the data from the output of the quantization means included in the timing extractor in accordance with an output from the pseudo-synchronous clock generation section included in the timing extractor.

17. A DVD device comprising:
the timing extractor of claim 1, and
a signal processing circuit for decoding the data from the output of the quantization means included in the timing extractor in accordance with an output from the pseudo-synchronous clock generation section included in the timing extractor.

18. The timing extractor of claim 1, wherein the playback signal is supplied through a radio communication path or other communication path such as an optical fiber, a coaxial cable, or an electric power line.

19. The timing extractor of claim 1, wherein the playback signal is supplied from an optical disc, such as a DVD disc, a CD disc, or a Blu-ray disc.

* * * * *